(12) United States Patent
Kandanarachchi et al.

(10) Patent No.: US 9,261,782 B2
(45) Date of Patent: Feb. 16, 2016

(54) MALEIMIDE CONTAINING CYCLOOLEFINIC POLYMERS AND APPLICATIONS THEREOF

(71) Applicant: Promerus, LLC, Brecksville, OH (US)

(72) Inventors: Pramod Kandanarachchi, Brecksville, OH (US); Larry F. Rhodes, Silver Lake, OH (US)

(73) Assignee: PROMERUS, LLC, Brecksville, OH (US)

( * ) Notice: Subject to any disclaimer, the term of this patent is extended or adjusted under 35 U.S.C. 154(b) by 64 days.

(21) Appl. No.: 14/034,682

(22) Filed: Sep. 24, 2013

(65) Prior Publication Data

US 2014/0087293 A1    Mar. 27, 2014

Related U.S. Application Data

(60) Provisional application No. 61/705,248, filed on Sep. 25, 2012.

(51) Int. Cl.
| | |
|---|---|
| *G03F 7/023* | (2006.01) |
| *G03F 7/40* | (2006.01) |
| *C08F 232/02* | (2006.01) |
| *C08F 232/08* | (2006.01) |
| *C08F 8/14* | (2006.01) |
| *G03F 7/022* | (2006.01) |

(52) U.S. Cl.
CPC ............. *G03F 7/0233* (2013.01); *C08F 8/14* (2013.01); *C08F 232/02* (2013.01); *C08F 232/08* (2013.01); *G03F 7/022* (2013.01); *G03F 7/0226* (2013.01); *G03F 7/40* (2013.01)

(58) Field of Classification Search
CPC ....... G03F 7/0226; G03F 7/0233; G03F 7/40; C08F 232/02

USPC ................. 430/18, 191, 192, 193, 326, 330; 526/259, 262, 281

See application file for complete search history.

(56) References Cited

U.S. PATENT DOCUMENTS

| | | | |
|---|---|---|---|
| 2002/0198356 A1 * | 12/2002 | Dershem et al. ............... | 528/170 |
| 2004/0082724 A1 * | 4/2004 | Dershem et al. ............... | 525/242 |
| 2008/0194740 A1 | 8/2008 | Elce et al. | |
| 2012/0056183 A1 | 3/2012 | Mueller et al. | |
| 2012/0129101 A1 | 5/2012 | Onishi et al. | |
| 2013/0017488 A1 | 1/2013 | Onishi et al. | |

FOREIGN PATENT DOCUMENTS

| | | |
|---|---|---|
| JP | 05165214 | 7/1993 |
| JP | 3262108 | 12/2001 |
| JP | 2003162054 | 6/2003 |

OTHER PUBLICATIONS

International Search Report mailed Jan. 23, 2014 for PCT/US2013/061280 filed Sep. 24, 2013.
Written Opinion of the International Searching Authority mailed Jan. 23, 2014 for PCT/US2013/061280 filed Sep. 24, 2013.

* cited by examiner

*Primary Examiner* — John Chu
(74) *Attorney, Agent, or Firm* — Balaram Gupta

(57) ABSTRACT

Various cycloolefinic/maleic anhydride polymers containing maleimide pendant groups and compositions thereof useful for forming self-imageable films encompassing such copolymers are disclosed. Such polymers encompass norbornene-type repeating units containing maleimide groups and maleic anhydride-type repeating units where at least some of such maleic anhydride-type repeating units have been ring-opened. The films formed from such copolymer compositions provide self imageable, low-k, thermally stable layers for use in microelectronic and optoelectronic devices.

20 Claims, 2 Drawing Sheets

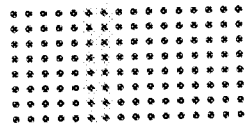
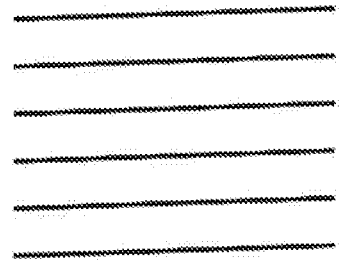
FIG. 1A　　　　　　　FIG. 1B
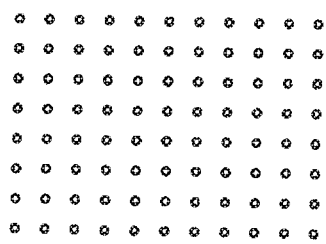
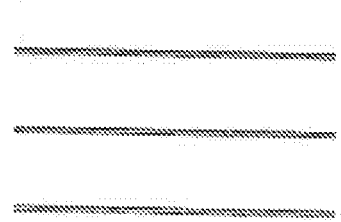
FIG. 2A　　　　　　　FIG. 2B
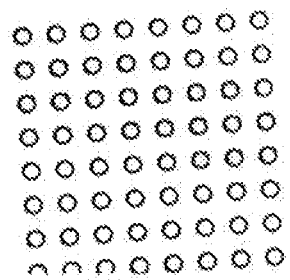
FIG. 3A　　　　　　　FIG. 3B

MALEIMIDE CONTAINING CYCLOOLEFINIC POLYMERS AND APPLICATIONS THEREOF

CROSS REFERENCE TO RELATED APPLICATIONS

This application claims the benefit of U.S. Provisional Application No. 61/705,248, filed Sep. 25, 2012, which is incorporated herein by reference in its entirety.

TECHNICAL FIELD

The present invention relates to a series of maleimide containing cycloolefinic polymers. More specifically, the present invention relates to a series of unsubstituted, mono- or di-substituted maleimide containing norbornene-type cycloolefinic polymers. This invention also relates to methods of making these polymers and applications thereof. In particular, the polymers of this invention are found to be useful in various electronic material applications including as overcoat layers in liquid crystal displays.

BACKGROUND

As the microelectronic devices are fabricated in smaller geometries there is an increasing demand for advanced materials that meet the stringent requirements of confined smaller geometries. In particular, sub-micron device geometries have become common place in the fabrication of a variety of liquid crystal displays (LCDs), organic light emitting diodes (OLEDs) and other radio frequency (RD and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated in the sub-micron levels.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication.

Thus, it would be desirable to have a material capable of forming a self-imageable layer to avoid the need for depositing a separate imaging layer. Such material should also be easy to apply to a substrate, have a low dielectric constant (3.9 or less) and thermal stability to temperatures in excess of 250° C. Of course, it is also desirable to have such materials available at a lower cost and feature such properties as positive tone or negative photoimaging capability, aqueous base developing capability, high transparency after heat stress and low weight loss at curing temperatures. It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides have low dielectric constants but still may not have low enough permittivity to be effective in highly integrated and/or miniaturized devices having increased wiring density and high signal speed. One such known polyimide material is the positive tone type photosensitive resin comprising a polyimide precursor and a diazoquinone-type compound disclosed in Japanese Patent No. 3,262,108.

Recently, it has been reported that certain copolymers containing both norbornene-type repeat units and maleic anhydride-type repeat units are useful in certain microelectronic applications featuring self-image forming layer capability, when image-wise-exposed to actinic radiation, see co-pending U.S. patent application Ser. No. 13/550,586, filed Jul. 16, 2012. These compositions are however suitable only for positive tone photoimaging and thermal curing with added additives to the polymeric composition. Thus there is still a need for polymeric compositions which can not only self-crosslink but also can be employed both as positive and negative tone compositions.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

FIG. 1A and FIG. 1B show positive tone lithographic images of 5 μm contact holes (FIG. 1A) and 3 μm lines/spaces (FIG. 1B) obtained from the polymer composition made from Example 17 (Table 7).

FIG. 2A and FIG. 2B show positive tone lithographic images of 10 μm contact holes (FIG. 2A) and 5 μm lines/spaces (FIG. 2B) obtained from the polymer composition made from Example 30 (Table 7).

FIG. 3A and FIG. 3B show negative tone lithographic images of 25 μm contact holes (FIG. 3A) and 10 μm lines/spaces (FIG. 3B) obtained from the polymer composition made from Example 30 (Table 8).

DETAILED DESCRIPTION

Figure 4:
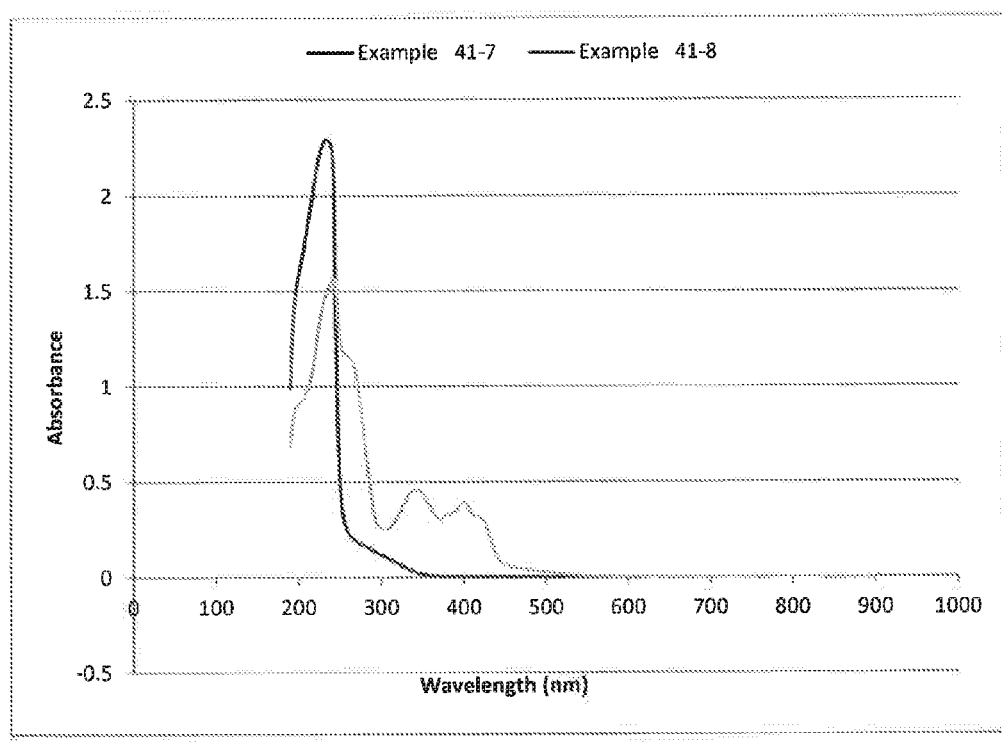
FIG. 4 shows UV-VIS spectra of polymer compositions of Example 41-7 and Example 41-8, respectively, both of which made from polymer Example 17.

Embodiments in accordance with the present invention are directed to various polymers, including but not limited to, copolymers and terpolymers that encompass at least one repeating unit derived from a certain type of norbornene-type monomer as described herein and at least one repeating unit derived from a maleic anhydride-type monomer, as such are defined hereinafter, and to compositions encompassing such polymers. Such polymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy$(C_1-C_{15})$alkyl", "hydroxy$(C_1-C_{15})$alkyl", "$(C_1-C_{15})$alkylcarbonyl", "$(C_1-C_{15})$alkoxycarbonyl$(C_1-C_{15})$alkyl", "$(C_1-C_{15})$alkoxycarbonyl", "amino$(C_1-C_{15})$alkyl", "$(C_1-C_{15})$alkylamino", "$(C_1-C_{15})$alkylcarbamoyl$(C_1-C_{15})$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarboyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$ alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$ arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$alkoxy, $(C_1-C_6)$thioalkyl, $(C_1-C_6)$perfluoroalkoxy, —$NH_2$, Cl, Br, I, F, —NH$(C_1-C_6)$alkyl, and —N($(C_1-C_6)$alkyl)$_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," "copolymer composition" or "terpolymer composition" are used herein interchangeably and are meant to include at least one synthesized polymer, copolymer or terpolymer, as well as residues from initiators, solvents or other elements attendant to the synthesis of such polymers, where such residues are understood as not being covalently incorporated thereto. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formulae (I) or (III), or maleic anhydride monomers of formula (II) wherein the resulting polymers are formed by 2,3 enchainment of norbornene-type monomers with maleic anhydride monomers as shown below:

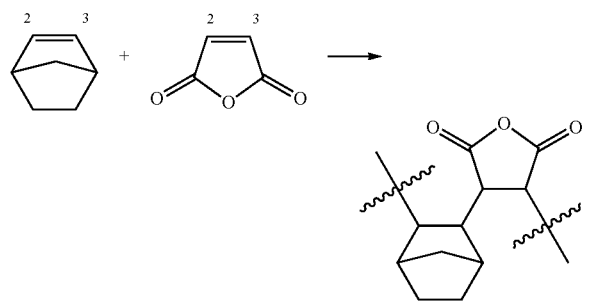

It should be understood that depending upon the monomeric compositions in a given polymer the repeat units may not always be alternating. That is to say, for example, in a copolymer containing other than 50:50 molar ratios of norbornene-type monomers with maleic anhydride monomers, the repeat units are not always alternating but with random blocks of monomers with the higher molar content.

The term "low K" refers in general to a dielectric constant less than that of thermally formed silicon dioxide (3.9) and when used in reference to a "low-K material" it will be understood to mean a material having a dielectric constant of less than 3.9.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray and electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various monomers that are contemplated to be part of polymer composition embodiments in accordance with the present invention are generally known in the art. In general, the polymers of this invention encompass a wide range of "polycyclic" repeating units. As defined herein, the terms "polycyclic olefin" or "polycycloolefin" mean the same and are used interchangeably to represent several of the monomeric compounds used to prepare the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is the bicyclic monomer, bicyclo[2.2.1]hept-2-ene, commonly referred to as norbornene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a,5,8,8a-octahydro-1,4:5,8-dimethanonaphthalene, 1,4,4a,5,6,7,8,8a-octahydro-1,4-epoxy-5,8-methanonaphthalene, and the like.

As mentioned above, the monomeric compounds employed in this invention can be synthesized by any of the procedures known to one skilled in the art. Specifically, several of the starting materials used in the preparation of the monomers used herein are known or are themselves commercially available. The monomers employed herein as well as several of the precursor compounds may also be prepared by methods used to prepare similar compounds as reported in the literature and as further described herein. See for instance, U.S. Patent Application No. US2012/0056183 A1.

In general, an economical route for the preparation of monomers of formula (I), wherein m=0, as well as monomers of formula (III), where q=0, relies on the Diels-Alder addition reaction in which cyclopentadiene (IV) is reacted with a suitable dienophile of formula (V) or (VI) at suitable reaction temperatures which are typically at elevated temperatures to form the monomers of formula (I) or (III) generally shown by the following reaction scheme I:

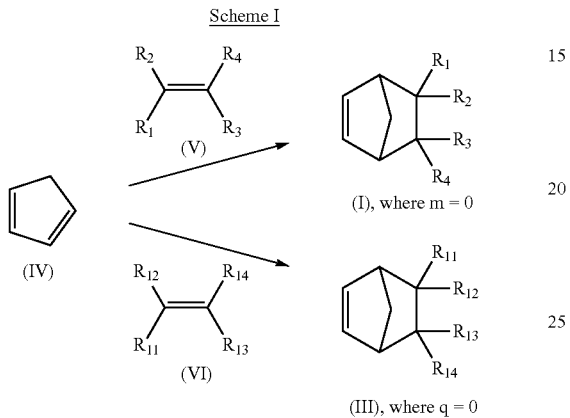

Wherein $R_1$, $R_2$, $R_3$, $R_4$, $R_{11}$, $R_{12}$, $R_{13}$ and $R_{14}$ are as defined herein.

Other monomeric compounds of formula (I), wherein m=1 or 2, as well as monomeric compounds of formula (III), where q=1 or 2, can also be prepared similarly by the thermolysis of dicyclopentadiene (DCPD, VII) in the presence of a suitable dienophile of formula (V) or (VI). The reaction proceeds by the initial thermolysis of DCPD (VII) to cyclopentadiene (CPD) followed by the Diels-Alder addition of CPD and the dienophile of formula (V) or (VI) and subsequent additions with a dienophile of formula (I) or (III), where respectively m or q=0, and so on, to give the adducts shown below in Scheme II:

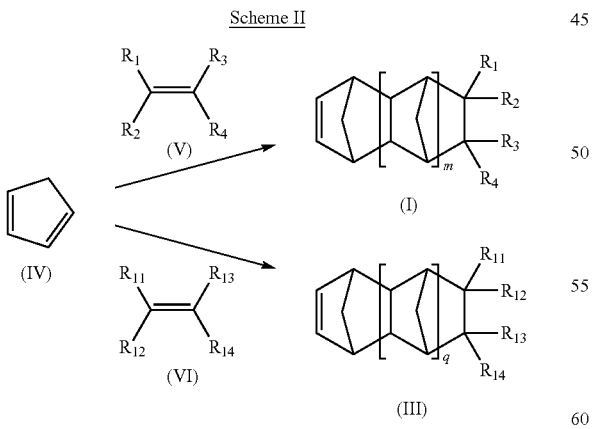

Wherein m, q, $R_1$, $R_2$, $R_3$, $R_4$, $R_{11}$, $R_{12}$, $R_{13}$, and $R_{14}$ are as defined herein.

The dienophiles of formulae (V) and (VI) are either generally available commercially or can be prepared following any of the known literature procedures.

Polymers

Embodiments in accordance with the present invention encompass copolymers having at least one repeating unit derived from a norbornene-type monomer as defined herein below and at least one repeating unit derived from a maleic anhydride-type monomer as defined herein below.

Thus, in accordance with the practice of this invention there is provided a polymer comprising:
a first type of repeating unit represented by formula (IA), said first type of repeating unit is derived from a monomer of formula (I):

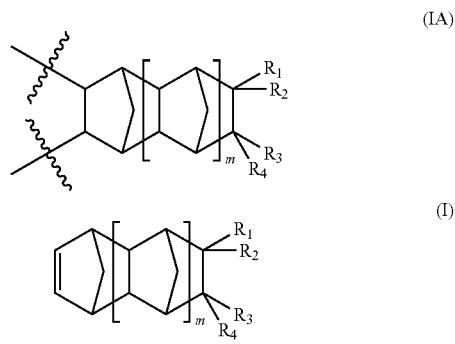

wherein:
m is an integer 0, 1 or 2;
at least one of $R_1$, $R_2$, $R_3$ and $R_4$ independently represents a group of formula (A):

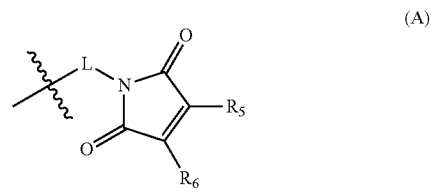

wherein:
L represents $(CH_2)_n$, $CH_2OCH_2CH_2$, $OCH_2$, $O(CH_2)$, $-OCH_2$, $(OCH_2CH_2)_p$, $(CH_2)_n-CO-O$, $(CH_2)_n$-phenylene, phenylene, where n and p independently are integers from 0 to 15 inclusive and o is an integer from 1 to 15 inclusive; and
$R_5$ and $R_6$ are each independently of one another hydrogen or a hydrocarbyl or halohydrocarbyl group selected from linear or branched $(C_1-C_6)$alkyl, linear or branched $(C_1-C_6)$haloalkyl or linear or branched perfluoro$(C_1-C_6)$alkyl; or
$R_5$ and $R_6$ taken together with the carbon atom to which they are attached form a $(C_5-C_7)$cycloalkyl or $(C_6-C_{12})$bicycloalkyl ring;
remaining one or more of $R_1$, $R_2$, $R_3$ and $R_4$ independently represents hydrogen, halogen or a hydrocarbyl or halohydrocarbyl group selected from linear or branched $(C_1-C_{12})$alkyl, hydroxy$(C_1-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, perfluoro$(C_6-C_{10})$aryl, perfluoro$(C_6-C_{10})$aryl$(C_1-C_3)$alkyl, $(C_5-C_{10})$heteroaryl, $(C_5-C_{10})$heteroaryl$(C_1-C_3)$alkyl, hydroxy, $(C_1-C_{12})$alkoxy, $(C_3-C_{12})$cycloalkoxy, $(C_5-C_{12})$bicycloalkoxy, $(C_7-C_{14})$tricycloalkoxy, $(C_6-C_{10})$aryloxy$(C_1-C_3)$alkyl, $(C_5-C_{10})$heteroaryloxy$(C_1-C_3)$alkyl, $(C_6-C_{10})$aryloxy, $(C_5-C_{10})$heteroaryloxy and $(C_1-C_6)$acyloxy; and a second type of repeating unit represented by formula (IIA) or (IIB), said second type of repeating unit is derived from a monomer of formula (II):

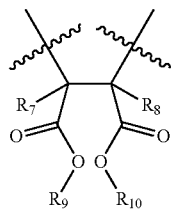

(IIA)

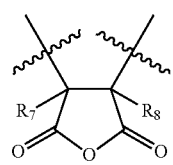

(IIB)

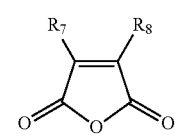

(II)

wherein:

$R_7$, $R_8$, $R_9$ and $R_{10}$ are each independently of one another hydrogen or a hydrocarbyl or halohydrocarbyl group selected from linear or branched $(C_1-C_9)$alkyl, fluorinated or perfluorinated$(C_1-C_9)$alkyl, $(C_1-C_{12})$alkoxy $(C_1-C_{12})$alkyl and $(C_1-C_{12})$alkoxy$(C_1-C_{12})$alkoxy$(C_1-C_{12})$alkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy$(C_1-C_6)$alkyl, acetoxy, phenyl, hydroxyphenyl and acetoxyphenyl.

In one of the embodiments, the polymer of this invention further comprises a third type of repeating unit represented by formula (IIIA), said third type of repeating unit is derived from a monomer of formula (III):

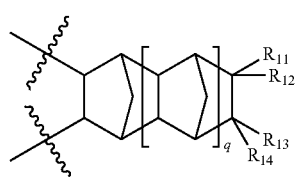

(IIIA)

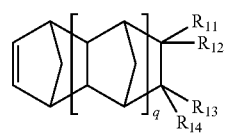

(III)

wherein:

q is an integer 0, 1 or 2;

$R_{11}$, $R_{12}$, $R_{13}$ and $R_{14}$ independently represents hydrogen, halogen or a hydrocarbyl or halohydrocarbyl group selected from linear or branched $(C_1-C_{12})$alkyl, perfluoro$(C_1-C_{12})$alkyl, hydroxy$(C_1-C_{12})$alkyl, $(C_3-C_{12})$ cycloalkyl, $(C_6-C_{12})$bicycloalkyl, $(C_7-C_{14})$tricycloalkyl, $(C_6-C_{10})$aryl, perfluoro$(C_6-C_{10})$aryl, perfluoro $(C_6-C_{10})$aryl$(C_1-C_3)$alkyl, $(C_5-C_{10})$heteroaryl, $(C_5-C_{10})$ heteroaryl$(C_1-C_3)$alkyl, hydroxy, $(C_1-C_{12})$alkoxy, $(C_3-C_{12})$cycloalkoxy, $(C_6-C_{12})$bicycloalkoxy, $(C_7-C_{14})$ tricycloalkoxy, $(C_6-C_{10})$aryloxy, $(C_6-C_{10})$aryloxy$(C_1-C_3)$alkyl, $(C_5-C_{10})$heteroaryloxy$(C_1-C_3)$alkyl, $(C_6-C_{10})$ aryloxy, $(C_5-C_{10})$heteroaryloxy and $(C_1-C_6)$acyloxy.

In another embodiment of this invention, there is provided a polymer wherein m is 0, $R_1$ is a group of formula (A) where L is $(CH_2)_n$ or $(CH_2)_n$-phenylene, where n is an integer from 1 to 10, inclusive, each $R_5$ and $R_6$ independently of one another is hydrogen or methyl; $R_7$ and $R_8$ are hydrogen; each $R_9$ and $R_{10}$ independently of one another is hydrogen, methyl or n-butyl. In this embodiment, there is further provided a polymer, wherein $R_2$, $R_3$ and $R_4$ are each hydrogen.

In another embodiment of this invention, the polymer is a terpolymer containing the aforementioned first, second and third types of repeating units, wherein m is 0, $R_1$ is a group of formula (A) where L is $(CH_2)_n$ or $(CH_2)_n$-phenylene, where n is an integer from 1 to 10, inclusive; each $R_5$ and $R_6$ independently of one another is hydrogen or methyl; $R_7$ and $R_8$ are hydrogen; each $R_9$ and $R_{10}$ independently of one another is hydrogen, methyl or n-butyl. In this embodiment, there is further provided a polymer, wherein $R_2$, $R_3$ and $R_4$ are each hydrogen; q is 0 or 1; $R_{11}$, $R_{12}$, $R_{13}$ and $R_{14}$ are independently of each other selected from hydrogen, perfluoro$(C_1-C_5)$alkyl, pentafluorophenyl and pentafluorophenylmethyl.

Useful monomers for embodiments in accordance with the present invention are described generally herein and are further described by the monomer and substituent structures provided herein. With regard to the polymer composition embodiments of the present invention, it will be noted that such compositions can encompass a polymer containing at least one norbornene-type repeating unit and at least one maleic anhydride-type repeating unit as described herein. These two repeat units may be randomly arranged or may alternate or may form blocks, all such forms of polymers are part of this invention. In some embodiments, these two repeat units are mostly alternating. In other embodiments, such polymer compositions can encompass a polymer containing two or more distinct types of norbornene-type repeating units and at least one maleic anhydride-type repeating unit, or a polymer containing at least one norbornene-type repeating unit and two or more distinct types of maleic anhydride-type of repeating units as further described herein.

In still other embodiments, the polymer compositions can encompass a blend of polymers encompassing at least two polymers such as described above or one or more of such a copolymer and a norbornene-type homopolymer containing first type of repeating units as described herein.

Generally speaking, as to various possible substituents defined for $R_1$, $R_2$, $R_3$, $R_4$, $R_{11}$, $R_{12}$, $R_{13}$ and $R_{14}$, it should be noted that such substituents are broadly defined as "hydrocarbyl" group. As defined hereinabove, such definition of "hydrocarbyl" group includes any $C_1$ to $C_{30}$ alkyl, aryl, aralkyl, alkaryl, cycloalkyl, or heteroalkyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, adamantyl, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $(C_1-C_{10})$alkyl, haloalkyl, perhaloalkyl, aryl, and/or cycloalkyl group(s). Representative substituted cycloalkyl groups include, among others, 4-t-butylcyclohexyl and 2-methyl-2-adamantyl. A non-limiting representative substituted aryl group is 4-t-butylphenyl.

Further, as noted above, any one or more of $R_5$ to $R_{10}$ can also be a halohydrocarbyl group, where such group includes any of the hydrocarbyls mentioned above where at least one, but less than all, of the hydrogen atoms of the hydrocarbyl is replaced by a halogen (fluorine, chlorine, bromine or iodine). Additionally, any one or more of $R_5$ to $R_{10}$ can be a perhalocarbyl group, where such group includes any of the hydrocarbyls mentioned above where all of the hydrogen atoms of the hydrocarbyl are replaced by a halogen. Representative perfluorinated substituents include, but are not limited to, pentafluorophenyl, trifluoromethyl, pentafluoroethyl, perfluoropropyl, perfluorobutyl, perfluorohexyl, and so on.

In some embodiments the perhalohydrocarbyl groups can include perhalogenated phenyl and perhalogenated alkyl groups. In other embodiments, the perfluorinated groups can include pentafluorophenyl, trifluoromethyl, perfluoroethyl, perfluoropropyl, perfluorobutyl, and perfluorohexyl. In addition to halogen substituents, cycloalkyl, aryl and aralkyl groups of such embodiments can be substituted with any $(C_1-C_5)$alkyl, $(C_1-C_{12})$haloalkyl, aryl, and/or cycloalkyl group.

Various types of norbornene-type monomers can be employed in order to form the polymers of this invention which contain the first repeat units derived therefrom. It will be understood that embodiments in accordance with the present invention contain first repeat units which encompass a photoactive cross-linking functionality. Various types of photo active cross-linkable functionalities can be employed. Examples of such photoactive systems include but not limited to maleimides, coumarins and cinnamates. It is believed that these functionalities not only increase photoefficiency but also enhance the utility of the polymers of the present invention in various optoelectronics applications. Accordingly, exemplary first repeating unit is derived from a monomer, but not limited to those monomers selected from the group consisting of:

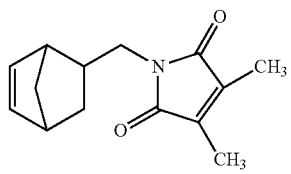

1-(bicyclo[2.2.1]hept-5-en-2-ylmethyl)-3,4-dimethyl-1H-pyrrole-2,5-dione (MeDMMINB)

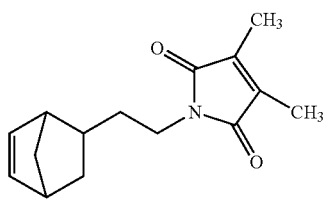 [SMILES: CC1=C(C)C(=O)N(CCC2CC3C=CC2C3)C1=O]

1-(2-(bicyclo[2.2.1]hept-5-en-2-yl)ethyl)-3,4-dimethyl-1H-pyrrole-2,5-dione (EtDMMINB)

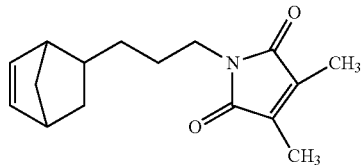 [SMILES: CC1=C(C)C(=O)N(CCCC2CC3C=CC2C3)C1=O]

1-(3-(bicyclo[2.2.1]hept-5-en-2-yl)propyl)-3,4-dimethyl-1H-pyrrole-2,5-dione (PrDMMINB)

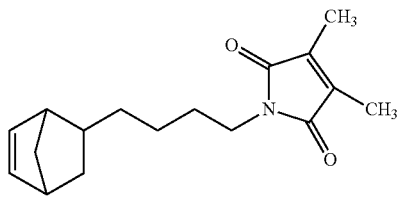 [SMILES: CC1=C(C)C(=O)N(CCCCC2CC3C=CC2C3)C1=O]

1-(4-(bicyclo[2.2.1]hept-5-en-2-yl)butyl)-3,4-dimethyl-1H-pyrrole-2,5-dione (BuDMMINB)

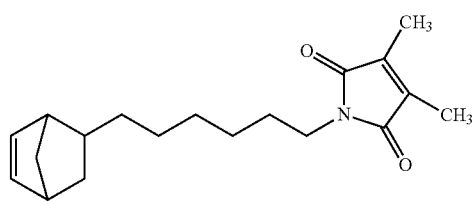 [SMILES: CC1=C(C)C(=O)N(CCCCCCC2CC3C=CC2C3)C1=O]

1-(6-(bicyclo[2.2.1]hept-5-en-2-yl)hexyl)-3,4-dimethyl-1H-pyrrole-2,5-dione (HxDMMINB)

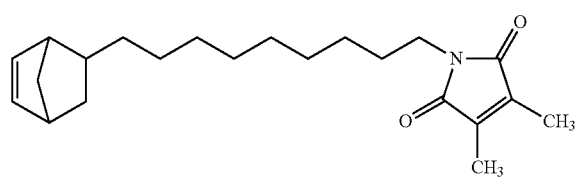 [SMILES: CC1=C(C)C(=O)N(CCCCCCCCCC2CC3C=CC2C3)C1=O]

1-(9-(bicyclo[2.2.1]hept-5-en-2-yl)nonyl)-3,4-dimethyl-1H-pyrrole-2,5-dione (NoDMMINB)

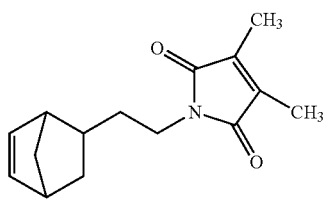 [SMILES: CC1=C(C)C(=O)N(CCC2CC3C=CC2C3)C1=O]

1-(12-(bicyclo[2.2.1]hept-5-en-2-yl)dodecyl)-3,4-dimethyl-1H-pyrrole-2,5-dione (DodDMMINB)

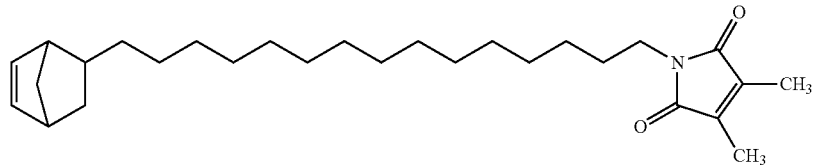 [SMILES: CC1=C(C)C(=O)N(CCCCCCCCCCCCCCCC2CC3C=CC2C3)C1=O]

1-(15-(bicyclo[2.2.1]hept-5-en-2-yl)pentadecyl)-3,4-dimethyl-1H-pyrrole-2,5-dione (PdcDMMINB)

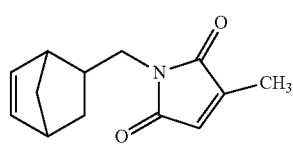 [SMILES: CC1=CC(=O)N(CC2CC3C=CC2C3)C1=O]

1-(bicyclo[2.2.1]hept-5-en-2-ylmethyl)-3-methyl-1H-pyrrole-2,5-dione (MeMMINB)

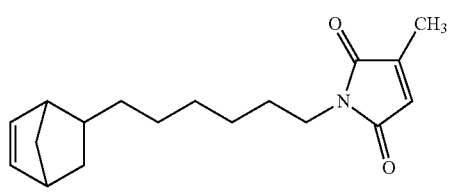 [SMILES: CC1=CC(=O)N(CCCCCCC2CC3C=CC2C3)C1=O]

1-(6-(bicyclo[2.2.1]hept-5-en-2-yl)hexyl)-3-methyl-1H-pyrrole-2,5-dione (HxMMINB)

1-(15-(bicyclo[2.2.1]hept-5-en-2-yl)pentadecyl)-3-methyl-1H-pyrrole-2,5-dione (PdcMMINB)

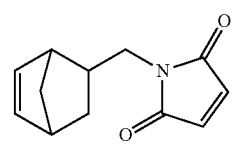 [SMILES: O=C1C=CC(=O)N1CC1CC2C=CC1C2]

1-(bicyclo[2.2.1]hept-5-en-2-ylmethyl)-1H-pyrrole-2,5-dione (MeMINB)

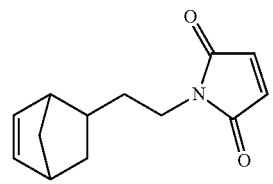 [SMILES: O=C1C=CC(=O)N1CCC1CC2C=CC1C2]

1-(2-(bicyclo[2.2.1]hept-5-en-2-yl)ethyl)-1H-pyrrole-2,5-dione (EtMINB)

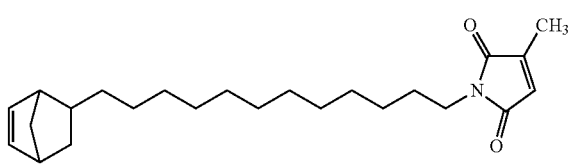

1-(12-(bicyclo[2.2.1]hept-5-en-2-yl)dodecyl)-3-methyl-1H-pyrrole-2,5-dione (DodMMINB)

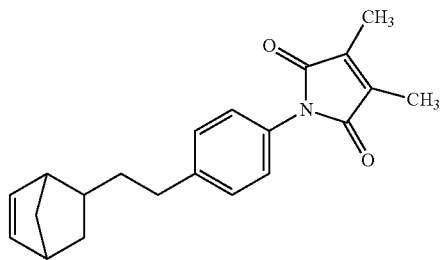 [SMILES: CC1=C(C)C(=O)N(c2ccc(CCC3CC4C=CC3C4)cc2)C1=O]

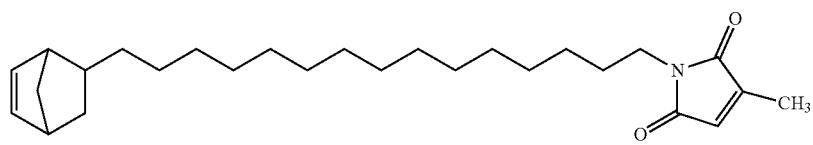

15

1-(4-(2-(bicyclo[2.2.1]hept-5-en-2-yl)ethyl)phenyl)-
3,4-dimethyl-1H-pyrrole-2,5-dione (EtPhDMMINB)

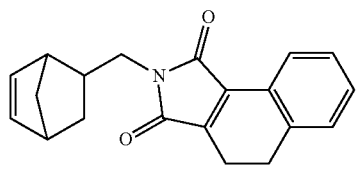 [SMILES: O=C1C2=C(C(=O)N1CC1CC3C=CC1C3)c1ccccc1CC2]

2-(bicyclo[2.2.1]hept-5-en-2-ylmethyl)-4,5-dihydro-
1H-benzo[e]isoindole-1,3(2H)-dione (DHNMI-
MeNB)

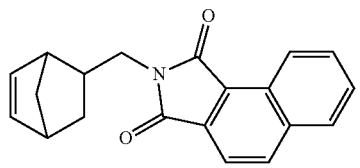 [SMILES: O=C1c2ccc3ccccc3c2C(=O)N1CC1CC2C=CC1C2]

2-(bicyclo[2.2.1]hept-5-en-2-ylmethyl)-1H-benzo[e]
isoindole-1,3(2H)-dione (NMIMeNB)

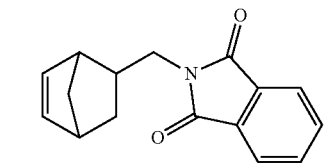 [SMILES: O=C1c2ccccc2C(=O)N1CC1CC2C=CC1C2]

2-(bicyclo[2.2.1]hept-5-en-2-ylmethyl)isoindoline-1,
3-dione (PIMeNB)

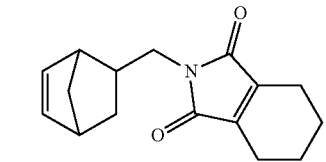 [SMILES: O=C1C2=C(CCCC2)C(=O)N1CC1CC2C=CC1C2]

2-(bicyclo[2.2.1]hept-5-en-2-ylmethyl)-4,5,6,7-tet-
rahydro-1H-isoindole-1,3(2H)-dione

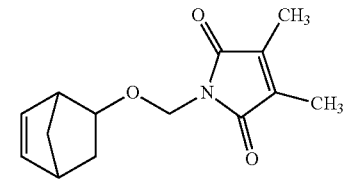 [SMILES: CC1=C(C)C(=O)N(COC2CC3C=CC2C3)C1=O]

16

1-((bicyclo[2.2.1]hept-5-en-2-yloxy)methyl)-3,4-
dimethyl-1H-pyrrole-2,5-dione (DMMIOxMeNB)

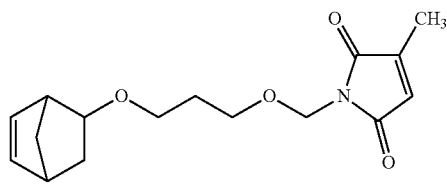 [SMILES: CC1=CC(=O)N(COCCCOC2CC3C=CC2C3)C1=O]

1-((3-(bicyclo[2.2.1]hept-5-en-2-yloxy)propoxy)
methyl)-3-methyl-1H-pyrrole-2,5-dione

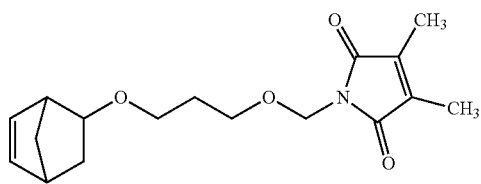 [SMILES: CC1=C(C)C(=O)N(COCCCOC2CC3C=CC2C3)C1=O]

1-(2-(2-(bicyclo[2.2.1]hept-5-en-2-yloxy)ethoxy)
ethyl)-3,4-dimethyl-1H-pyrrole-2,5-dione (DMMI-
EtOEtNB)

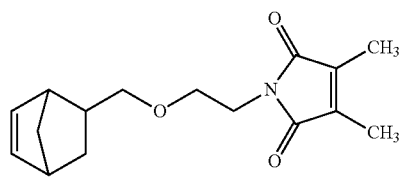 [SMILES: CC1=C(C)C(=O)N(CCOCC2CC3C=CC2C3)C1=O]

1-(2-(bicyclo[2.2.1]hept-5-en-2-ylmethoxy)ethyl)-3,
4-dimethyl-1H-pyrrole-2,5-dione

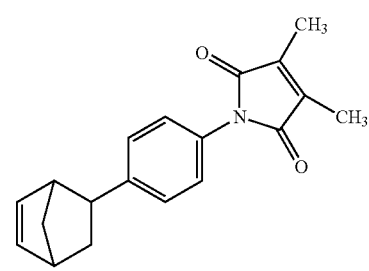 [SMILES: CC1=C(C)C(=O)N(c2ccc(C3CC4C=CC3C4)cc2)C1=O]

1-(4-(bicyclo[2.2.1]hept-5-en-2-yl)phenyl)-3,4-dim-
ethyl-1H-pyrrole-2,5-dione (DMMIPhNB)

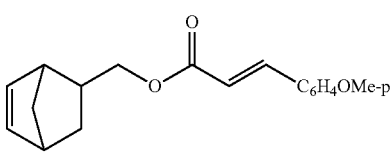

17

(E)-bicyclo[2.2.1]hept-5-en-2-ylmethyl 3-(4-methoxyphenyl)acrylate (MeOCinnNB)

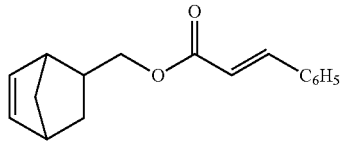

bicyclo[2.2.1]hept-5-en-2-ylmethyl cinnamates (CinnNB)

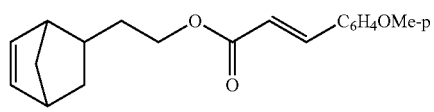

(E)-2-(bicyclo[2.2.1]hept-5-en-2-yl)ethyl 3-(4-methoxyphenyl)acrylate (EtMeOCinnNB)

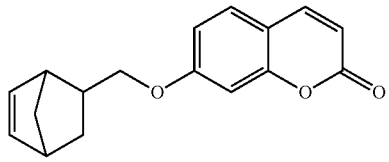 [SMILES: O=c1ccc2ccc(OCC3CC4C=CC3C4)cc2o1]

7-(bicyclo[2.2.1]hept-5-en-2-ylmethoxy)-2H-chromen-2-one (MeCoumNB)

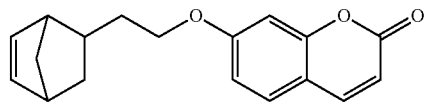 [SMILES: O=c1ccc2ccc(OCCC3CC4C=CC3C4)cc2o1]

7-(2-(bicyclo[2.2.1]hept-5-en-2-yl)ethoxy)-2H-chromen-2-one (EtCoumNB)

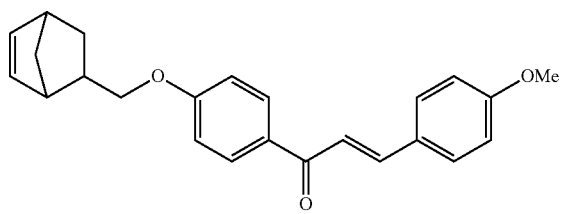 [SMILES: COc1ccc(/C=C/C(=O)c2ccc(OCC3CC4C=CC3C4)cc2)cc1]

18

(E)-1-(4-(bicyclo[2.2.1]hept-5-en-2-ylmethoxy)phenyl)-3-(4-methoxyphenyl)prop-2-en-1-one MCH-MNB); and

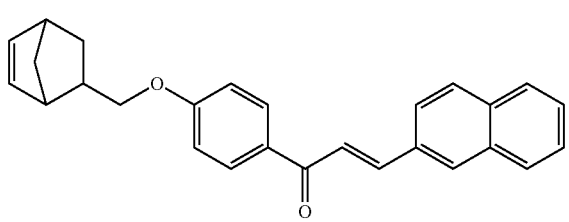 [SMILES: O=C(/C=C/c1ccc2ccccc2c1)c1ccc(OCC2CC3C=CC2C3)cc1]

(E)-1-(4-(bicyclo[2.2.1]hept-5-en-2-ylmethoxy)phenyl)-3-(naphthalen-2-yl)prop-2-en-1-one (NPCH-MNB)

Turning now to second repeating unit to form the polymer of this invention it is contemplated that any maleic anhydride derivative can be used as a monomer, including maleic anhydride itself. Exemplary monomers of such type include but not limited to those selected from the group consisting of

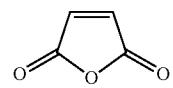

maleic anhydride

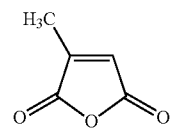

2-methyl-maleic anhydride (3-methylfuran-2,5-dione)

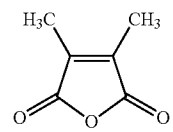

2,3-dimethyl-maleic anhydride (3,4-dimethylfuran-2,5-dione)

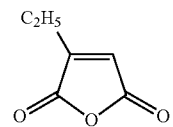

2-ethyl-maleic anhydride (3-ethylfuran-2,5-dione)

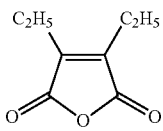

2,3-diethyl-maleic anhydride (3,4-diethylfuran-2,5-dione)

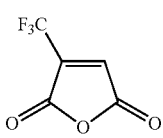

2-trifluoromethyl-maleic anhydride (3-trifluoromethylfuran-2,5-dione)

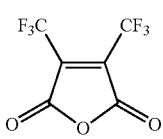 [SMILES: O=C1OC(=O)C(C(F)(F)F)=C1C(F)(F)F]

2,3-Bis(trifluoromethyl)-maleic anhydride (3,4-bis(trifluoromethyl)furan-2,5-dione); and

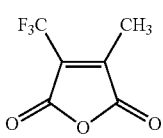

2-methyl-3-trifluoromethyl-maleic anhydride (3-methyl-4-(trifluoromethyl)furan-2,5-dione)

As noted, the polymer of this invention can also contain a third repeating unit, which is generally derived from a norbornene type monomer of formula (III). Any of the known norbornene-type monomers of formula (III) can be employed. For example, various such monomers are disclosed in U.S. Patent Publication No. US 2012/0056183 A1. Exemplary monomers which form such third repeating unit include but not limited to those monomers selected from the group consisting of:

norbornene (NB)

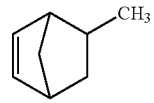

5-methylbicyclo[2.2.1]hept-2-ene (MeNB)

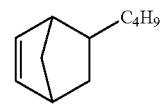

5-butylbicyclo[2.2.1]hept-2-ene (BuNB)

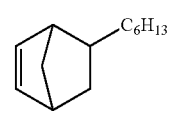

5-hexylbicyclo[2.2.1]hept-2-ene (HexNB)

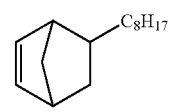

5-octylbicyclo[2.2.1]hept-2-ene (OctNB)

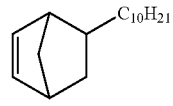

5-decylbicyclo[2.2.1]hept-2-ene (DecNB)

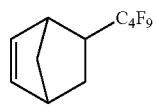

5-perfluorobutylbicyclo[2.2.1]hept-2-ene (NBC$_4$F$_9$)

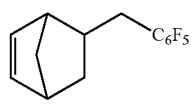

5-pentafluorobenzylbicyclo[2.2.1]hept-2-ene (PFBNB)

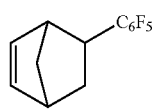

5-pentafluorophenylbicyclo[2.2.1]hept-2-ene (PFPNB)

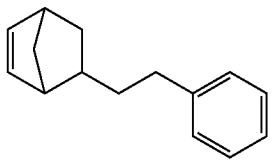 [SMILES: C1=CC2CC1CC2CCc1ccccc1]

5-phenethylbicyclo[2.2.1]hept-2-ene (PENB)

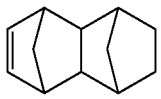

1,2,3,4,4a,5,8,8a-octahydro-1,4:5,8-dimethanonaphthalene (TD)

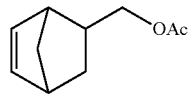 [SMILES: CC(=O)OCC1CC2C=CC1C2]

bicyclo[2.2.1]hept-5-en-2-ylmethyl acetate (MeOAcNB)

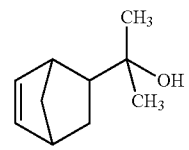

2-(bicyclo[2.2.1]hept-5-en-2-yl)propan-2-ol (NBXOH)

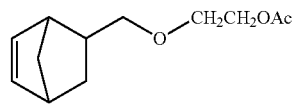

2-(bicyclo[2.2.1]hept-5-en-2-ylmethoxy)ethyl acetate (NBCH$_2$GlyOAc)

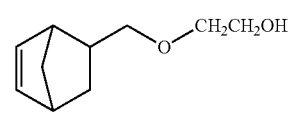

2-(bicyclo[2.2.1]hept-5-en-2-ylmethoxy)ethanol ((NBCH$_2$GlyOH)

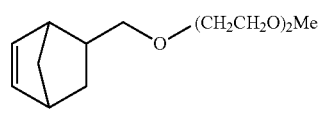

5-((2-(2-methoxyethoxy)ethoxy)methyl)bicyclo[2.2.1]hept-2-ene (NBTON)

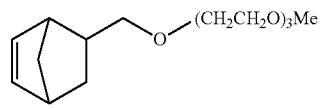

1-(bicyclo[2.2.1]hept-5-en-2-yl)-2,5,8,11-tetraoxadodecane (NBTODD)

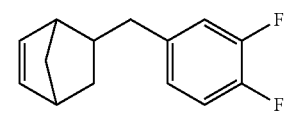 [SMILES: Fc1ccc(CC2CC3C=CC2C3)cc1F]

5-(3,4-difluorobenzyl)bicyclo[2.2.1]hept-2-ene (NBCH$_2$C$_6$H$_3$F$_2$)

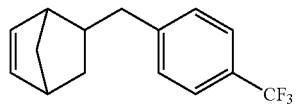 [SMILES: FC(F)(F)c1ccc(CC2CC3C=CC2C3)cc1]

5-(4-(trifluoromethyl)benzyl)bicyclo[2.2.1]hept-2-ene (NBCH$_2$C$_6$H$_4$CF$_3$)

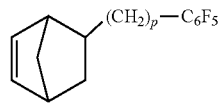

5-((perfluorophenyl)alkyl)bicyclo[2.2.1]hept-2-ene (NBalkylC$_6$F$_5$), where p=1 (methyl), 2 (ethyl), 3 (propyl), 4 (butyl), 5 (pentyl) or 6 (hexyl)

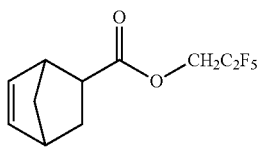

2,2,3,3,3-pentafluoropropyl bicyclo[2.2.1]hept-5-ene-2-carboxylate (PFPrCNB)

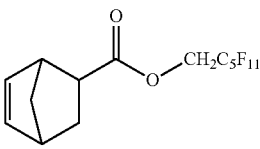

perfluoropentylmethyl bicyclo[2.2.1]hept-5-ene-2-carboxylate (PFPMeCNB)

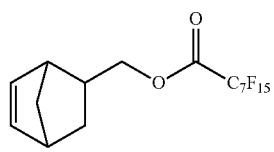

1,1,2,2,3,3,4,4-octafluorobutyl bicyclo[2.2.1]hept-5-ene-2-carboxylate (FOCHNB)

bicyclo[2.2.1]hept-5-en-2-ylmethyl perfluorooctanoate (C$_8$PFAcNB)

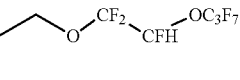

5-((1,1,2-trifluoro-2-(perfluoropropoxy)ethoxy)methyl)bicyclo[2.2.1]hept-2-ene (PPVENB)

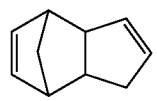

dicyclopentadiene (DCPD)

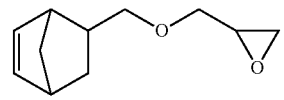

2-(6-(bicyclo[2.2.1]hept-5-en-2-yl)hexyl)oxirane (HxONB)

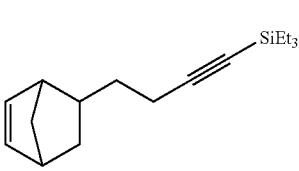

2-((bicyclo[2.2.1]hept-5-en-2-ylmethoxy)methyl)oxirane (MGENB); and (4-(bicyclo[2.2.1]hept-5-en-2-yl)but-1-yn-1-yl)triethylsilane (AkSiNB)

Polymer Preparation

In general, the polymers of this invention can be prepared by any one of the known procedures in the art. For instance, one or more monomers of formula (I) as described herein can be polymerized along with one or more monomers of formula (II) to form the polymers of this invention containing the respective monomeric repeat units as represented by formula (IA) or (IIB), which are called hereinafter as "COMA-MI" polymers. The maleic anhydride repeat units of formula (IIB) can also be ring opened either partially or completely by subjecting to suitable reaction conditions to form repeat units of formula (IIA) as described herein, which are called hereinafter as "ROMA-MI" polymers. Further, one or more monomers of formula (III) can be further included in these polymerization reactions to form polymer compositions which would additionally include repeat units of formula (IIIA). Again, any of the polymerization methods can be employed to form the polymer compositions of this invention. In general, the polymerization can be carried out either in solution using a desirable solvent or in mass, and in both instances, suitably in the presence of a catalyst or an initiator. Any of the known catalyst system which brings about the polymerization of the monomers of formula (I) with monomers of formula (II) can be used along with monomers of formula (III).

Advantageously, it has now been found that polymers of this invention can be prepared by any of the known free radical polymerization procedures. Typically in a free radical polymerization process, the monomers are polymerized in a solvent at an elevated temperature (about 50° C. to about 150° C.) in the presence of a free radical initiator. Suitable initiators include but are not limited to azo compounds and peroxides. Non-limiting examples of azo compounds include azobisisobutyronitrile (AIBN), (E)-dimethyl 2,2'-(diazene-1,2-diyl)bis(2-methylpropanoate) (AMMP), (E)-2,2'-(diazene-1,2-diyl)bis(2,4-dimethylpentanenitrile (ADMPN), 1,1'-azobis(cyclohexanecarbonitrile) (ABCN), azobisisocapronitrile and azobisisovaleronitrile. Non-limiting examples of peroxides include hydrogen peroxide, tert-butylhydroperoxide, di-(tertiary)-butyl peroxide, benzoyl peroxide, lauryl peroxide, and methyl ethyl ketone peroxide. As noted, any of the other known initiators, including other azo compounds and peroxides can also be used in this polymerization process.

Suitable polymerization solvents for the aforementioned free radical polymerization reactions include hydrocarbon, haloalkane and aromatic solvents. Exemplary hydrocarbon solvents include but are not limited to alkanes and cycloalkanes such as pentane, hexane, heptane and cyclohexane. Exemplary haloalkane solvents include but or not limited to dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, 1-chloropentane, Freon™ 112 halocarbon solvent. Exemplary aromatic solvents include but are not limited to benzene, toluene, xylene, mesitylene, chlorobenzene, and o-dichlorobenzene. Other organic solvents such as diethyl ether, tetrahydrofuran, acetates (e.g., ethyl acetate) and other esters, lactones, ketones and amides are also useful. Mixtures of one or more of the foregoing solvents can be utilized as a polymerization solvent. In some embodiments the solvents employed include cyclohexane, toluene, mesitylene, dichloromethane and 1,2-dichloroethane.

As noted, the polymer as obtained above is then subjected to suitable reaction conditions to ring open the maleic anhydride repeat units of formula (IIB). Any of the known methods which would bring about such a ring opening can be employed in this method of the invention. Non-limiting examples of such ring opening reactions include reacting the polymer with a suitable alcohol in the presence of a suitable base or an acid. Non-limiting examples of alcohols include methanol, ethanol, n-propanol, iso-propanol, n-butanol, iso-butanol, tert-butanol, pentanol, hexanol, fluoroalkanol, methoxyethanol, methoxyethoxymethanol, methoxyethoxyethanol, and the like. Non-limiting examples of base include sodium hydroxide, lithium hydroxide, potassium hydroxide, cesium hydroxide, ammonia, ammonium hydroxide, magnesium hydroxide, calcium hydroxide, barium hydroxide, and the like. Various other known organic bases can also be employed. Representative examples of which include, tetramethylammonium hydroxide (TMAH), tetraethylammonium hydroxide (TEAH), pyridine, imidazole, and the like. Non-limiting examples of acids include acetic acid, trifluoroacetic acid, sulfuric acid, hydrochloric acid, methanesulfonic acid, trifluoromethanesulfonic acid, p-toluenesulfonic acid, benzenesulfonic acid, and mixtures thereof.

The aforementioned ring opening reactions can be carried out using any of the known methods in the art. Typically, such reactions are carried out in a suitable solvent or a mixture of solvents in the presence of a base and an alcohol. Examples of base and alcohol are already described above. Non-limiting examples of solvents include tetrahydrofuran (THF), acetonitrile, dimethylacetamide (DMAc), dimethyl sulfoxide (DMSO), N-methylpyrrolidone (NMP), ethyl acetate, methyl ethyl ketone (MEK), toluene, hexane, water, and mixtures thereof. The reaction can be carried out at suitable temperature including ambient, sub-ambient and super-ambient conditions. Typically, the reaction temperature employed is in the range of about 40 to 90° C. and in certain embodiments the temperature can be in the range of 50 to 80° C. and in some other embodiments it can be in the range of 60 to 70° C.

The ROMA-MI polymers so formed in accordance with this invention, depending upon contacting with such aforementioned reagents will cause either complete or partial ring open of the maleic anhydride repeating units to form a repeat unit of formula (IIA). Thus, such ROMA polymers may have a randomly ordered repeat units of formula (IA), (IIA) and (IIB), as well as repeat units of formula (IIIA), wherein the repeat units of formula (IIA) may include a combination of diacid (i.e., both $R_9$ and $R_{10}$ are hydrogen), monoester (i.e., one of $R_9$ and $R_{10}$ is hydrogen) or a diester (i.e., both $R_9$ and $R_{10}$ are alkyl) depending upon the degree of esterification with the alcohol. Thus in accordance with this aspect of the embodiment of this invention, the ring opened portion of the maleic anhydride repeat unit of formula (IIA) is in the order of from about 1 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. Further, as noted above, the ring opened maleic anhydride repeat unit may be partially hydrolyzed to monocarboxylic acid (i.e., one of $R_9$ and $R_{10}$ is hydrogen) or fully hydrolyzed to di-carboxylic acid (i.e., both $R_9$ and $R_{10}$ are hydrogen). The amount of free acid present can be tailored by controlling the degree of esterification with an alcohol. Thus in one of the embodiments the amount of diacid present in the maleic anhydride repeat units of formula (IIA) is from about 0 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. That is to say, when 50 mole percent of the repeat unit of formula (IIA) is diacid, the remaining portions of the repeat units are esterified, thus portions of the repeat units may be mono-esterified or di-esterified to give a cumulative total of 50% of the repeat units to be esterified.

The COMA-MI and ROMA-MI polymers formed according to this invention generally exhibit a weight average molecular weight (Mw) of at least about 2,000. In another embodiment, the polymer of this invention has a Mw of at least about 6,000. In yet another embodiment, the polymer of this invention has a Mw of at least about 10,000. In some other embodiments, the polymer of this invention has a Mw of at least about 25,000.

Polymer Compositions/Applications

As mentioned above, embodiments in accordance with the present invention are also directed to various layer forming photosensitive polymer compositions containing co- or ter-polymers encompassing one or more norbornene-type repeating units of formula (IA), (IIIA) and maleic-anhydride type repeating units of formula (IIB) (COMA-MI), and partially or completely ring opened maleic anhydride type repeat units of formula (IIA) (ROMA-MI) resulting therefrom as described hereinabove and hereafter. Such polymer compositions may further contain optionally a photo active compound (PAC), optionally an epoxy resin and a solvent. Further, such compositions are capable of forming films useful as self-imageable layers in the manufacture of microelectronic and opto-electronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers in liquid crystal displays or in microelectronic devices. It will be noted that such examples are only a few of the many uses for such a self-imageable film, and such examples do not serve to limit the scope of such films or the polymers and polymer compositions that are used to form them.

Advantageously, it has now been found that such polymer composition containing norbornene-type repeat units of formula (IA) provide several desirable properties. For instance, the maleimide pendent groups of formula (A) enables negative tone image-wise photo-patterning of the films of this invention without the use of other cross-linkers, such as multi-functional epoxy cross-linkers and/or photoactive compounds. That is to say, the "negative tone" photo imaging can be carried out exploiting the photo-curing ability of the "maleimide" functionality.

Advantageously, on the other hand, the compositions of this invention are also useful as "positive tone" photo-imaging by formulating differently with a suitable "photoactive compound" (PAC). By doing so, the photo curing effect of maleimide functionality is muted. Further, this can also be achieved by employing different sources of actinic radiation whereby only the PACs are active at those exposed wavelengths and/or at different exposure doses. This aspect becomes even more apparent from the following examples that follow.

It has also been found that the maleimide functionality in ROMA-MI polymers of this invention offers certain advantages. For instance, the ROMA-MI polymers can be thermally cured without using any additional additives such as multifunctional epoxy cross linkers. As a result, the resulting thermally cured film features certain desirable properties, for example, lower dielectric constant, among others.

Further, it has also been found that proper utilization of one or more monomers of formula (I), one or more monomers of formula (II) and optionally one or more monomers of formula (III), it is now possible to form a polymer which can be formulated to form films having desirable properties. For instance, it has now been found that proper tailoring of the ratios of monomers utilized and the respective chemical structures of formulae (I) (II) or (III) it is possible to tailor a polymer having very low dielectric constant. In addition, various other additives, such as PACs, cross-linkers, etc., can either be eliminated and/or reduced thus offering not only simplified formulations but also significant property advantages as well as cost savings. Most notable advantages being the compositions of this invention can be formulated into negative tone compositions which can be photo-cured with or without a cross-linker or a photo-sensitizer (i.e., a PAC). Similarly the compositions of this invention can be thermally cured with or without an epoxy cross-linker, thus offering lower dielectric constant photo and/or thermally cured films.

Non-limiting examples of suitable photoactive compounds (PACs) that can be employed in these photosensitive compositions encompasses a photoactive group, such as 1,2-naphthoquinonediazide-5-sulfonyl moiety and/or a 1,2-naphthoquinonediazide-4-sulfonyl moiety as represented by structural formulae (VIIa) and (VIIb), respectively:

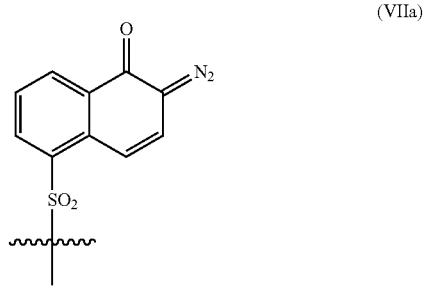

(VIIa)

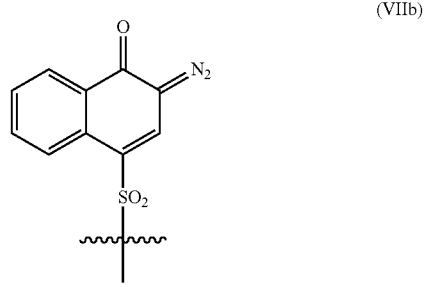

(VIIb)

Other such photoactive moieties, among others, include sulfonyl benzoquinone diazide group represented by structural formula (VIIc):

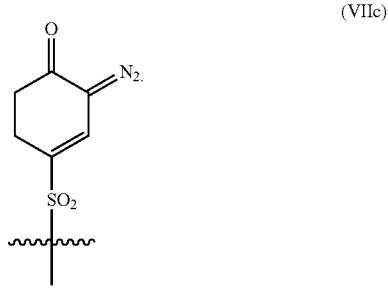

(VIIc)

Generally the functional groups of formulae (VIIa), (VIIb) and/or (VIIc) are incorporated into the photosensitive composition as an esterification product of the respective sulfonyl chloride (or other reactive moiety) and a phenolic compound, such as one or more of the exemplary compounds represented below collectively as structural formulae (VIIIa) to (VIIIag). Thus, any one, or any mixture of two or more of such esterification products are combined with the resin in forming the photosensitive resin compositions of the present invention. In the formulae (VIII) below, Q may represent any of the structures (VIIa), (VIIb) or (VIIc). Advantageously, when a portion of a film or a layer of the photosensitive composition is exposed to appropriate electromagnetic radiation, these esterification products generate a carboxylic acid which enhances the solubility of such exposed portion in an aqueous alkali solution as compared to any unexposed portions of such film. Generally such photosensitive materials are incorporated into the composition in an amount from 1 to 50 parts by weight material to 100 parts by weight resin. Where the specific ratio of the photosensitive material to resin is a function of the dissolution rate of exposed portions as compared to unexposed portions and the amount of radiation required to achieve a desired dissolution rate differential.

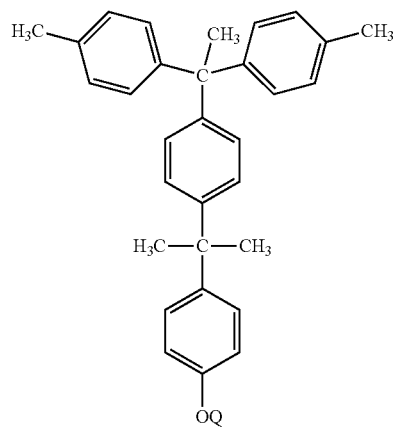
(VIIIa)

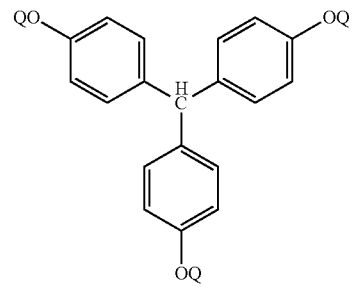
(VIIIb)

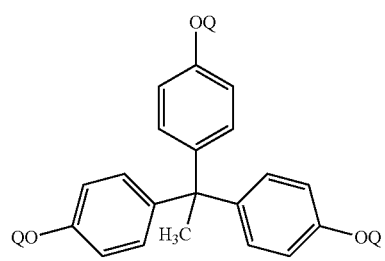
(VIIIc)

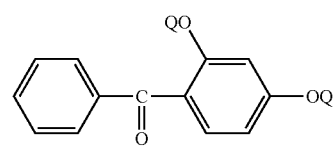
(VIIId)

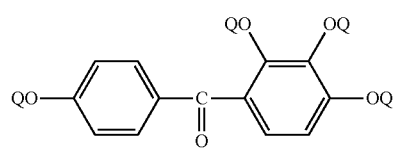
(VIIIe)

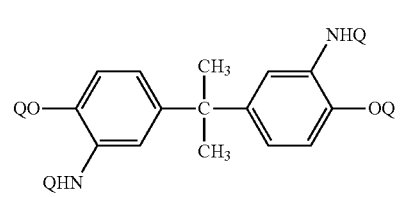
(VIIIf)

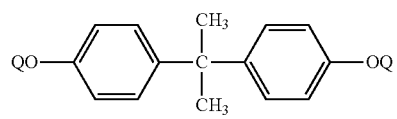
(VIIIg)

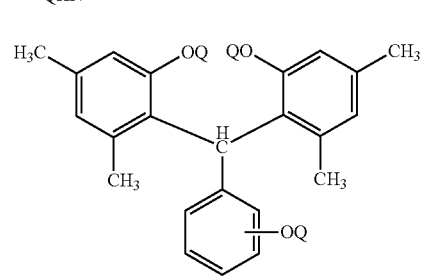
(VIIIh)

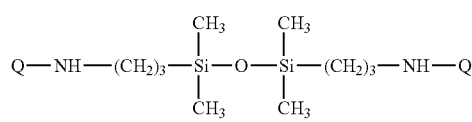
(VIIIi)

(VIIIj)

-continued
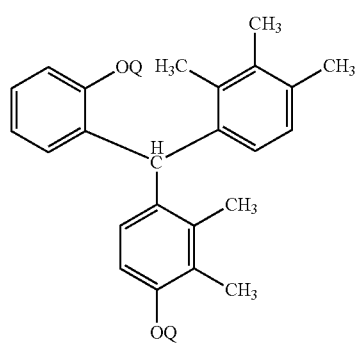 (VIIIk)
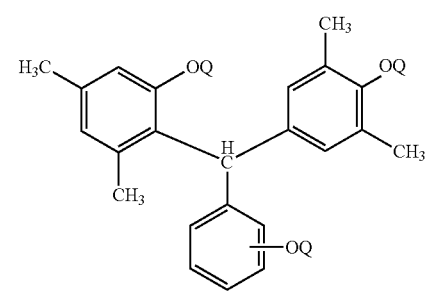 (VIIIl)
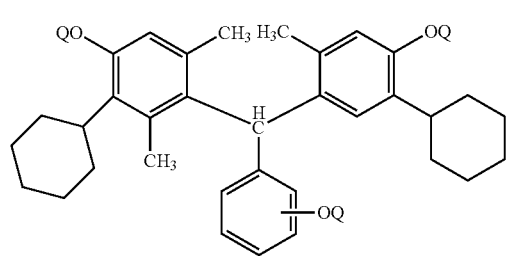 (VIIIm)
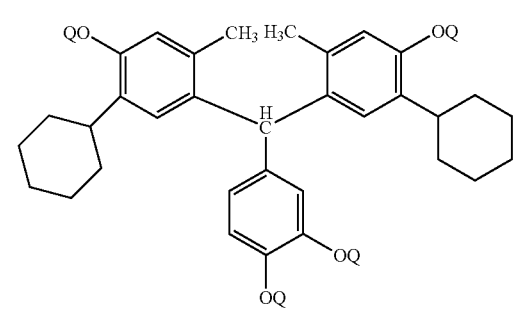 (VIIIn)
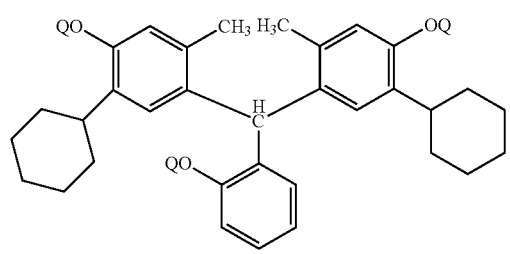 (VIIIo)
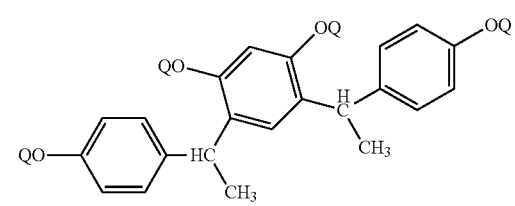 (VIIIp)
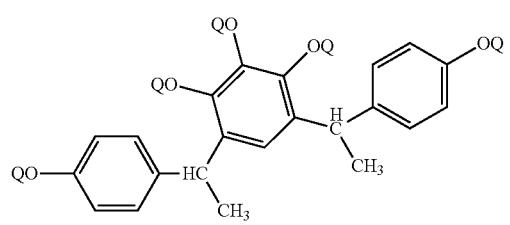 (VIIIq)
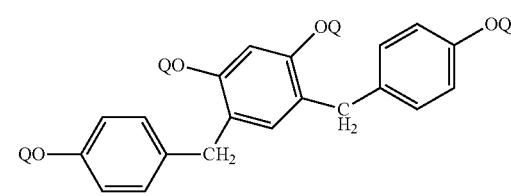 (VIIIr)
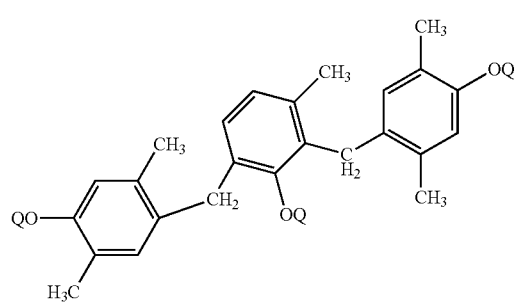 (VIIIs)
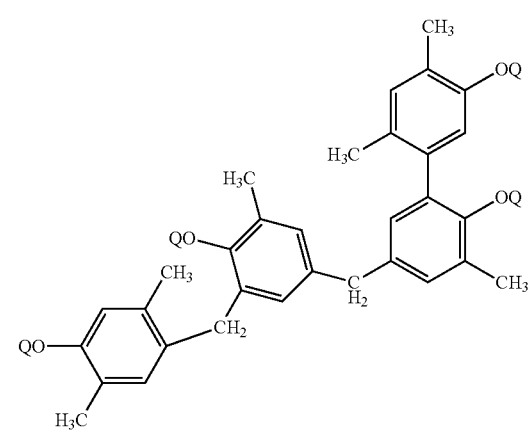 (VIIIt)

-continued
(VIIIu)
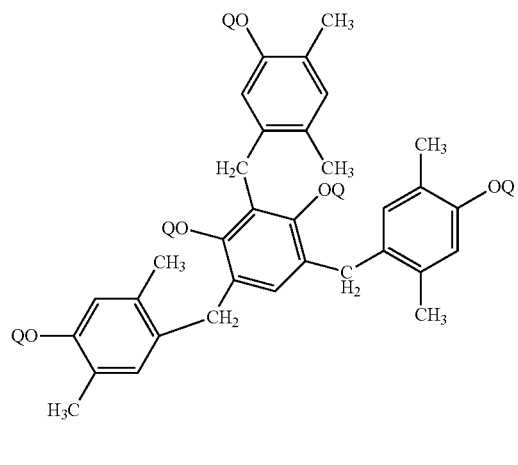
(VIIIv)
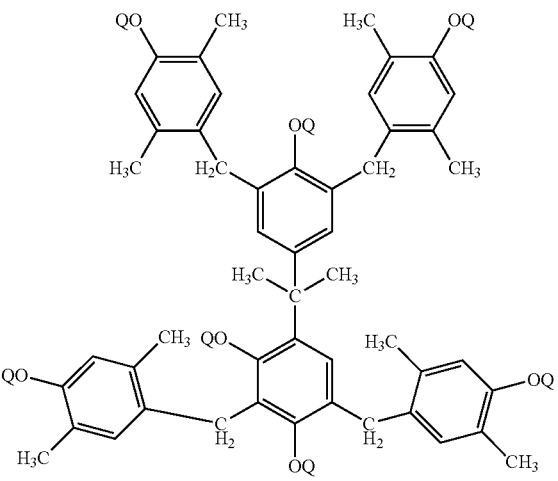
(VIIIw)
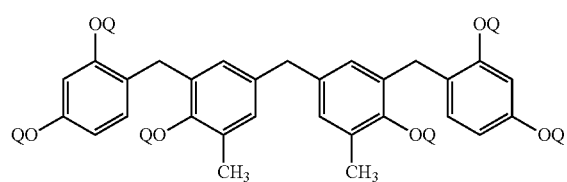
(VIIIx)
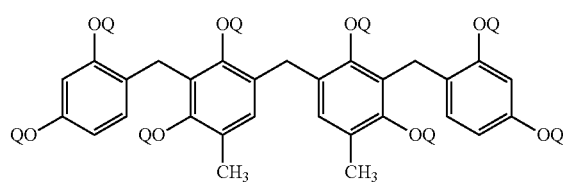
(VIIIy)
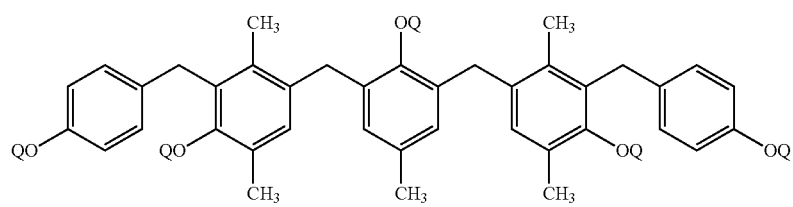
(VIIIz)
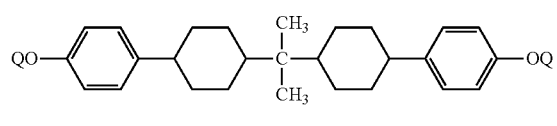
(VIIIaa)
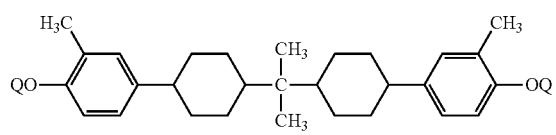
(VIIIab)
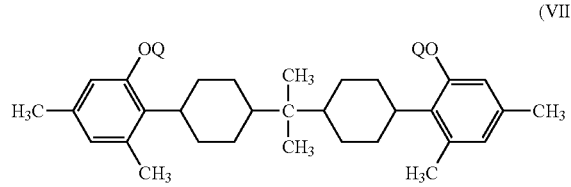
(VIIIac)
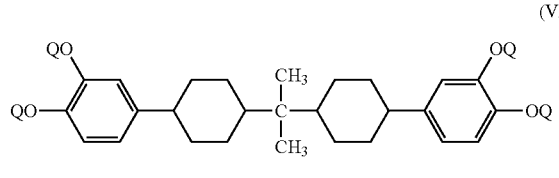
(VIIIad)
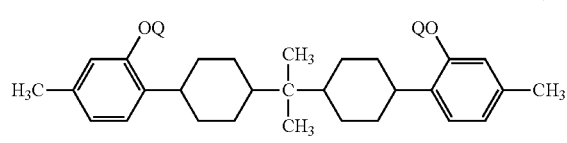
(VIIIae)
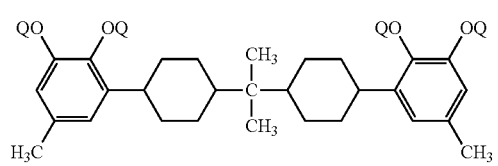

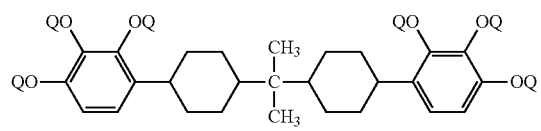
(VIIIaf)

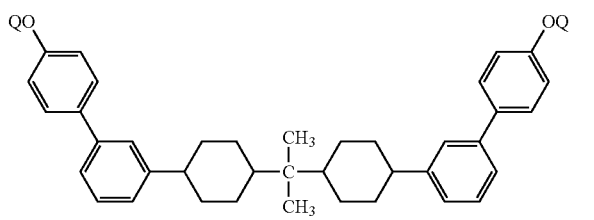
(VIIIag)

In the above listed PACs of formulae (VIIIa) to (VIIIag), Q refers to any one of photoactive moieties of formulae (VIIa), (VIIb) or (VIIc). Several of the PACs listed above are commercially available. For example, PAC-5570 of formula (VIIIc) (St. Jean Photochemicals Inc., Quebec, Canada), SCL6 of formula (VIIId) (Secant Chemicals Inc., Winchendon, Mass., USA), Tris-P 3M6C-2-201 of formula (VIIIo) (also referred to herein as TrisP), collectively TS-200, TS-250 and TS-300 of formula (VIIIa), and 4NT-300 of formula (VIIIe) (all from Toyo Gosei Co. Ltd., Chiba, Japan). It should be noted that for PACs of the types TS-200, TS-250 and TS-300, the degree of substitution of Qs also varies based on the product used. For instance, TS-200 is substituted with 67% of Q, TS-250 is substituted with 83% of Q, and TS-300 with 100% of Q, the unsubstituted portion being hydrogen. Again, Q in each of these instances refers to one of group (VIIa), (VIIb) or (VIIc).

The amount of PACs incorporated into the polymer compositions depends upon the type of polymer used and to the type of exposure contemplated, i.e., "positive tone" or "negative tone" compositions. The amount can vary generally from about 0 to 50 parts by weight of the polymer and typically from about 2 to about 30 parts by weight, although other advantageous amounts of such materials are also appropriate and within the scope of the present invention. Generally, lesser amount of PAC is used in a "negative tone" composition, and can be optional, i.e., depending upon the type of polymer used there may not be a need to use any additional PAC in such compositions. However, for "positive tone" compositions the PAC is always used and the amount can vary as noted.

Exemplary epoxies and other cross-linking additives, as mentioned above, include, but are not limited to, bisphenol A epoxy resin (LX-1—Daiso Chemical Co., Osaka, Japan), 2,2'-(((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (Techmore VG3101L—Mitsui Chemical Inc.), trimethylolpropane triglycidylether (TMPTGE—CVC Specialty Chemicals, Inc.), and 1,1,3,3,5,5-hexamethyl-1,5-bis(3-(oxiran-2-ylmethoxy)propyl)trisiloxane (DMS-E09—Gelest, Inc.) as shown below:

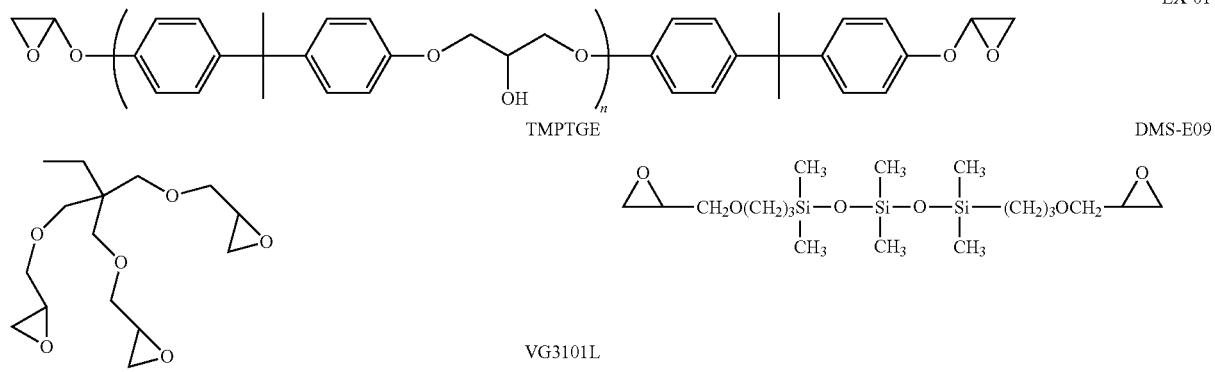

LX-01

TMPTGE

DMS-E09

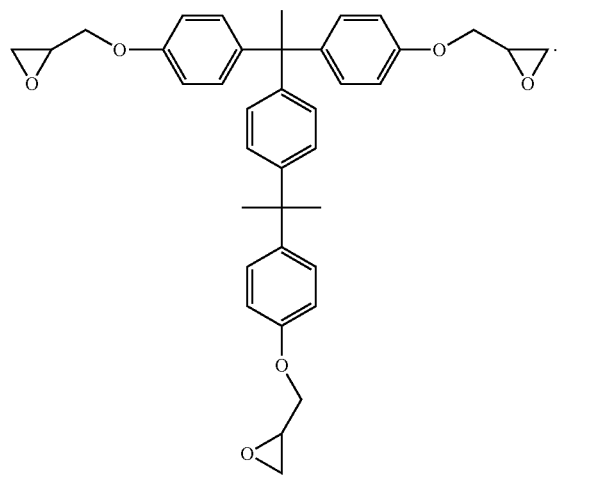

VG3101L

Techmore

Still other exemplary epoxy resins or cross-linking additives include, among others Araldite MT0163 and Araldite CY179 (manufactured by Ciba Geigy); and EHPE-3150, Epolite GT300 and (manufactured by Daicel Chemical).

The amount of epoxy compound may also vary as noted for PACs, and in certain instances the epoxy used can be optional especially in the case of a "negative tone" compositions, as noted above. The amount can vary generally from about 0 to 50 parts by weight of the polymer and typically from about 2 to about 30 parts by weight, although other advantageous amounts of such materials are also appropriate and within the scope of the present invention.

It will be understood that exemplary embodiments of the present invention, can include other suitable components and/or materials such as are necessary for formulating and using the polymer compositions in accordance with the present invention. Such other suitable components and/or materials include one or more components selected from sensitizer components, solvents, catalyst scavengers, adhesion promoters, stabilizers, and reactive diluents.

Where appropriate, any suitable sensitizer component can be included in the polymer compositions of the present invention. Such suitable sensitizer components include, photosensitizers, such as, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone (commercially sold under the name CPTX from Lambson), phenothiazine, and mixtures thereof. Generally, photosensitizers absorb energy from the radiated light source and transfers that energy to the desirable substrate/reactant, which in the present invention are the polymers of this invention.

The polymer compositions in accordance with the present invention may further contain optional components as may be useful for the purpose of improving properties of both the composition and the resulting layer, for example the sensitivity of the composition to a desired wavelength of exposure radiation. Examples of such optional components include various additives such as a dissolution promoter, a surfactant, a silane coupling agent, a leveling agent, an antioxidant, a fire retardant, a plasticizer, a crosslinking agent or the like. Such additives include, but are not limited to, bisphenol A and 5-norbornene-2,3-dicarboxylic acid as a dissolution promoter, a silicone surfactant such as TSF4452 (Toshiba Silicone Co., Ltd), a silane coupling agent such as γ-aminopropyl triethoxysilane, a leveling agent, such as γ-(methacryloyloxy propyl)trimethoxysilane, antioxidants such as IRGANOX™ 1035 and 1076 (Ciba Specialty Chemicals), a fire retardant such as a trialkyl phosphate or other organic phosphoric compound, a plasticizer such as, poly(propylene glycol) and a crosslinking agent such as a multifunctional epoxy compound.

In the embodiments of the present invention, these components are generally dissolved in a solvent and prepared into a varnish form to be used. As a solvent, there may be used N-methyl-2-pyrrolidone (NMP), γ-butyrolactone, N,N-dimethylacetamide, di methylsulfoxide, diethyleneglycol dimethylether, diethyleneglycol diethylether, diethyleneglycol dibutylether, propyleneglycol monomethylether (PGME), dipropylene glycol monomethylether, propyleneglycol monomethylether acetate (PGMEA), methyl lactate, ethyl lactate, butyl lactate, methylethyl ketone (MEK), cyclohexanone, tetrahydrofuran, methyl-1,3-butyleneglycolacetate, 1,3-butyleneglycol-3-monomethylether, methyl pyruvate, ethyl pyruvate, methyl-3-methoxypropionate or the like. They may be used solely or mixed by optionally selecting two or more kinds.

As mentioned above, some embodiments of the present invention encompass structures, such as optoelectronic structures, which include at least one self-imageable layer formed from a film of a polymer composition embodiment in accordance with the present invention. As previously mentioned, the polymer of such a composition embodiment encompasses at least one repeating unit derived from a norbornene-type monomer of formula (IA) and at least one repeating unit derived from a maleic anhydride-type monomer of formula (IIA) or (IIB). As also noted, the polymer composition embodiment further encompasses at least one casting solvent, optionally one or more photo active compound (PAC) as enumerated herein and optionally one or more epoxy resin as described above.

With regard to the composition embodiments of the present invention, such embodiments provide for either "negative tone" or "positive tone" self-imageable films. Generally, for negative tone compositions, exposed portions of a layer formed from such composition become insoluble or less soluble in a developer solution than portions unexposed to such radiation. Thus, upon exposure to suitable radiation and developing exposed portions will remain on the substrate, whereas unexposed portions are removed. For the positive tone compositions, on the other hand, the unexposed portions of a layer formed from such composition become less soluble, i.e., is inhibited, in developer. The exposed portions of a layer formed from such composition become more soluble in a developer solution than portions unexposed to such radiation. In such a case, the more soluble portions are washed away during an image development process using an aqueous base solution. The aforementioned exposed portions' increased solubility in aqueous base being the result of the at least one PAC added to the composition generating a carboxylic acid which enhances the solubility of the exposed portion in an aqueous alkali solution as compared to any unexposed portions where the PAC remains unchanged.

The aforementioned structure embodiments of the present invention are readily formed by first casting a polymer composition over an appropriate substrate to form a layer thereof, then heating the substrate to an appropriate temperature for an appropriate time, where such time and temperature are sufficient to remove essentially all of the casting solvent of such composition. After such first heating, the layer is image-wise exposed to an appropriate wavelength of actinic radiation. As one of skill in the art knows, for the "positive tone" compositions, the aforementioned image-wise exposure causes the PAC contained in exposed portions of the layer to undergo a chemical reaction that enhances the dissolution rate of such exposed portions to an aqueous base solution (generally a solution of tetramethyl ammonium hydroxide (TMAH)). In this manner, such exposed portions are removed and unexposed portions remain. On the other hand, for "negative tone" compositions the exposed areas become less soluble due to cross-linking and the unexposed areas are removed during developing step. Next a second heating is performed to cause cross-linking of portions of the polymer with the epoxy additive, thus essentially "curing" the polymer of such unexposed portions (or exposed portions for "negative tone" compositions) to form an aforementioned structure embodiment of the present invention.

It should be noted again that the second heating step is performed for both the negative and positive tone formulations. In this step of second heating, the thermal curing of the polymer layer can be achieved with or without the added additives, such as epoxies and/or other crosslinking agents as described herein. However, in the case of negative tone compositions it may be possible to achieve complete thermal curing without any additives, and by exploiting the crosslinkable groups present in the polymer of this invention itself.

The following examples, without being limiting in nature, illustrate methods for making polymer embodiments in accordance with the present invention. Such examples illustrate first forming the previously mentioned polymers, referred to herein as a cyclic olefin maleic anhydride polymers containing maleimide pendent groups (COMA-MI). Additionally, such examples describe forming ring-opened analogs of such COMA-MI polymers, referred to herein as ROMA-MI polymers.

It should further be noted that the following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES (General)

The following definitions have been used in the Examples that follow unless otherwise indicated:
MeDMMINB: 1-(bicyclo[2.2.1]hept-5-en-2-ylmethyl)-3,4-dimethyl-1H-pyrrole-2,5-dione; BuDMMINB: 1-(4-(bicyclo[2.2.1]hept-5-en-2-yl)butyl)-3,4-dimethyl-1H-pyrrole-2,5-dione; NoDMMINB: 1-(9-(bicyclo[2.2.1]hept-5-en-2-yl)nonyl)-3-methyl-1H-pyrrole-2,5-dione; TD: 1,2,3,4,4a,5,8,8a-octahydro-1,4:5,8-dimethanonaphthalene; $NBC_4F_9$: 5-(perfluorobutyl)bicyclo[2.2.1]hept-2-ene; PFBNB: 5-((perfluorophenyl)methyl)bicyclo-[2.2.1]hept-2-ene; PENB: 5-phenethylbicyclo[2.2.1]hept-2-ene; MA: maleic anhydride; AIBN: azobisisobutyronitrile; THF: tetrahydrofuran; NMP: N-methyl-2-pyrrolidone; DMSO-d6: perdeuterated dimethyl sulfoxide; TMPTGE: trimethylolpropane triglycidylether; COMA-MI: cyclic olefin maleic anhydride maleimide polymer; ROMA-MI: ring-opened maleic anhydride cyclic olefin maleimide polymer; TS: total solid; HPLC: high performance liquid chromatography; GPC: gel permeation chromatography; $M_w$: weight average molecular weight; $M_n$: number average molecular weight; FT-IR: Fourier transform-infrared; NMR: nuclear magnetic resonance; TGA: thermogravimetric analysis;

COMA-MI Polymers

The following Examples 1 through Example 15 illustrate the preparation of various COMA-MI polymers of this invention.

Example 1

BuDMMINB/MA Copolymer

Maleic Anhydride (MA, 8.1 g, 82.5 mmol), BuDMMINB (22.5 g, 82.5 mmol) and AIBN (0.90 g, 5.50 mmol) was dissolved in toluene (29.7 g) and charged to an appropriately sized reaction vessel. The solution was sparged with nitrogen for 30 min to remove oxygen and then heated with stirring to 70° C. The mixture was allowed to stir at 70° C. for about 20 to 24 hr, after which the solution was cooled to room temperature. (GPC (THF) Mw=7,300 Mn=3,700).

Examples 2-4

Example 1 was substantially repeated in Examples 2-4 with the exception of utilizing various other monomers as listed in Table 1. Also summarized in Table 1 are the amounts of monomers used along with the amounts of AIBN and toluene used. The measured $M_w$ and $M_n$ by GPC (THF) are also presented in Table 1 for each of these samples.

TABLE 1

| Ex # | TD (mmol) | MeDM MINB (mmol) | BuDM MINB (mmol) | MA (mmol) | AIBN (mmol) | toluene (g) | $M_w$ | $M_n$ |
|---|---|---|---|---|---|---|---|---|
| 2 | 48.7 | | 48.7 | 97.5 | 6.50 | 29.6 | 5100 | 2600 |
| 3 | | 95.0 | | 95.0 | 6.33 | 30.3 | 7500 | 3200 |
| 4 | 52.5 | 52.5 | | 105 | 7.00 | 29.7 | 4800 | 2300 |

Examples 5-10

Example 1 was substantially repeated in Examples 5-10 with the exception of utilizing various monomers as listed in Table 2. Also summarized in Table 2 are the amounts of monomers used along with the amounts of AIBN and toluene used. The percent conversion of monomers (Conv. %) and measured $M_w$ and $M_n$ by GPC (THF) are also presented in Table 2 for each of these samples.

TABLE 2

| Ex # | $NBC_4F_9$ (mmol) | PFBNB (mmol) | MeDM MINB (mmol) | BuDM MINB (mmol) | MA (mmol) | AIBN (mmol) | toluene (g) | Mw | Mn | Conv. (%) |
|---|---|---|---|---|---|---|---|---|---|---|
| 5 | | | 153 | | 153 | 15.3 | 47.73 | 7000 | 3600 | 100 |
| 6 | | | | 136 | 136 | 13.5 | 48.08 | 7200 | 4200 | 98 |
| 7 | | 67.5 | | 67.5 | 135 | 13.5 | 47.97 | 4400 | 2500 | 62 |
| 8 | | 72 | 72 | | 144 | 14.4 | 48.15 | 3700 | 2100 | 57 |
| 9 | 64 | | | 64 | 128 | 12.8 | 47.91 | 5700 | 3000 | 68 |
| 10 | 67.7 | | 67.7 | | 135.5 | 13.5 | 47.88 | 5800 | 2700 | 79 |

Examples 11-13

Example 1 was substantially repeated in Examples 11-13 with the exception of utilizing various monomers as listed in Table 3 and in each of these examples the reaction was carried out for a period of about 26 hours. Also in these Examples 11-13, AIBN was added in four equal portions over a 25 hour period using the following schedule: 0 hours, 6 hours, 19 hours, and 25 hours; the amount of AIBN listed in Table 3 is the cumulative amount of these four batches. Also summarized in Table 3 are the amounts of monomers used along with the amounts of AIBN and toluene used. The percent conversion of monomers (Conv. %) and measured $M_w$ and $M_n$ by GPC (THF) are also presented in Table 3 for each of these samples.

TABLE 3

| Ex # | NBC$_4$F$_9$ (mmol) | PFBNB (mmol) | MeDM MINB (mmol) | BuDM MINB (mmol) | MA (mmol) | AIBN (mmol) | toluene (g) | Mw | Mn | Conv. (%) |
|---|---|---|---|---|---|---|---|---|---|---|
| 11 |  | 43.7 | 43.7 |  | 87.5 | 21 | 19.60 | 4000 | 1900 | 100 |
| 12 |  | 41.3 |  | 41.3 | 82.5 | 19.8 | 19.63 | 5200 | 2300 | 98 |
| 13 | 38.7 |  |  | 38.7 | 77.5 | 18.6 | 19.42 | 9300 | 2900 | 99 |

Example 14

NoDMMINB/MA Copolymer

Maleic Anhydride (MA, 3.4 g, 35 mmol), NoDMMINB (12 g, 35 mmol) and AIBN (0.57 g, 3.5 mmol) was dissolved in toluene (9.7 g) and charged to an appropriately sized reaction vessel. The solution was sparged with nitrogen for 30 min to remove oxygen and then heated with stirring to 70° C. The mixture was allowed to stir at 70° C. for 15 hr, after which the solution was cooled to room temperature. (GPC (THF) Mw=10,200 Mn=5,200).

Example 15

BuDMMINB/MA Copolymer

Maleic Anhydride (MA, 15.2 g, 35 mmol), BuDMMINB (42.3 g, 35 mmol) and V-601 (dimethyl 2,2'-azobis(2-methylpropionate), from Wako Specialty Chemicals, 0.7 g, 3.1 mmol) was dissolved in toluene (56.8 g) and charged to an appropriately sized reaction vessel. The solution was sparged with nitrogen for 30 min to remove oxygen and then heated with stirring to 70° C. The mixture was allowed to stir at 70° C. for about 15 to 20 hr, after which the solution was cooled to room temperature. (GPC (THF) Mw=7,050 Mn=4,250).

ROMA-MI Polymers

Examples 16 through 30 illustrate a method of ring-opening the maleic anhydride repeating units of the COMA-MI polymers of Examples 1 through 15 with BuOH, respectively. In each of these Examples 40 g of BuOH was used and 15 g of BuOH was used only in Example 17. Example 30 illustrates a method of ring-opening the maleic anhydride repeating units with MeOH.

Example 16

ROMA-MI Polymer of BuDMMINB/MA of Example 3

An appropriately sized reaction vessel was loaded with NaOH (4.0 g, 100 mmol), BuOH (40 g, 540 mmol) and THF (15 g). The mixture was allowed to stir for about 1 to 3 hr at 60-70° C., then the polymer solution obtained in Example 3 (30 g of solid polymer in 30 g toluene) was added after diluting with 15 g of THF, and maintained at 60-70° C. After about 15 hr of the reaction at 70° C., the mixture was cooled to room temperature. The reaction mixture was then acidified with aqueous conc. hydrochloric acid (20 g), and then washed five to seven times (100 mL each wash) to remove residual salts and acid. Adequate amount of THF (10-30 mL) was added during each wash to facilitate the phase separation. The organic phase was separated and the polymer was precipitated in hexanes (about 3 to 10 fold excess). The resulting solid was re-dissolved in THF and precipitated in excess hexanes, and this procedure was repeated one more time. The solid polymer was finally separated by filtration and dried in a vacuum oven at 50-60° C. for 15 hr. The yield was calculated based on the conversion with BuOH and based on the conversion and monomer content as calculated in Example 1. The isolated ring-opened polymer with BuOH was characterized by GPC, FT-IR (which confirmed ring opening of the maleic anhydride as evidenced by the disappearance of anhydride carbonyl absorption peaks at 1774 and 1853 cm$^{-1}$) and $^{13}$C-NMR. Esterification ratio (% ester) was calculated by $^{13}$C NMR in DMSO-d6 by the values of integrals for —CH$_3$ of the butyl ester (—COOBu) to that of C=O for both ester (COOBu) and acid (—COOH). The degree of esterification was calculated to be 24%. Mw and Mn of the polymer was determined by GPC (THF) chromatography (Mw=6,800 Mn=2,150). Approximately, 23 g (62%) of the ROMA polymer of BuDMMINB/MA with BuOH was isolated.

Examples 17-29

Example 16 was substantially repeated in Examples 17-29 with the exception of utilizing various polymers formed respectively from Examples 1, 2 and 4-14 as listed in Table 4. Also summarized in Table 4 are the calculated molar amount of MA present in each of the polymer solutions, molar amount of NaOH used, amount of THF used to form the respective solutions of NaOH/BuOH, and additional quantities of THF used to dilute the polymer solutions obtained in Examples 1, 2 and 4-14. In all of these Examples 40 g of BuOH was used except that only 15 g of BuOH was used in Example 17. Also, in each of these examples the esterified product was protonated with 20 g of aqueous Conc. hydrochloric acid except that 8 g of Conc. HCl was used in Example 17. The weight average molecular weight (Mw) and number average molecular weight (Mn) of the resulting polymers were determined by GPC (TI-IF) except in Examples 17, 23, 24 and 28, GPC (DMAc) was used. The measured $M_w$ and $M_n$, percent ester formation (% ester), and yield of the ROMA-MI polymers (amount in grams and percent yield) are presented in Table 4 for each of these Examples.

TABLE 4

| Ex # | Polymer Ex # | MA mmol | NaOH mmol | THF for NaOH/BuOH | THF for polymer solution | $M_w$ | $M_n$ | % ester | Yield |
|---|---|---|---|---|---|---|---|---|---|
| 17 | 5 | 120 | 130 | 30 g | 30 g | 23100 | 12500 | 46 | 26 g, 53% |
| 18 | 1 | 82 | 100 | nu | 30 g | 6900 | 1900 | 36 | 25 g, 68% |
| 19 | 6 | 110 | 120 | 30 g | 30 g | 10250 | 4750 | 39 | 19 g, 39% |
| 20 | 14 | 30 | 33 | 10 g | 5 g | 8750 | 4800 | nc | 13 g, 80% |
| 21 | 4 | 100 | 110 | 15 g | 15 g | 4700 | 1650 | 38 | 22 g, 61% |
| 22 | 2 | 98 | 110 | nu | 30 g | 5750 | 1500 | 47 | 26 g, 69% |
| 23 | 10 | 110 | 120 | 30 g | 30 g | 21900 | 12000 | 46 | 22 g, 46% |
| 24 | 9 | 100 | 110 | 30 g | 30 g | 21100 | 9100 | 34 | 16 g, 34% |
| 25 | 13 | 78.0 | 86 | 30 g | 30 g | 10500 | 4200 | 42 | 15 g, 42% |
| 26 | 8 | 120 | 130 | 30 g | 30 g | 3900 | 2400 | 35 | 17 g, 35% |
| 27 | 11 | 88 | 97 | 30 g | 30 g | 6200 | 2700 | 49 | 18 g, 49% |
| 28 | 7 | 110 | 120 | 30 g | 30 g | 16800 | 10250 | 29 | 14 g, 29% |
| 29 | 1412 | 83 | 90 | 30 g | 30 g | 10500 | 3850 | 24 | 9 g, 24% | nu-none used; nc-not calculated

Example 30

ROMA-MI Polymer of BuDMMINB/MA of Example 15

An appropriately sized reaction vessel was loaded with NaOH (3 g, 75 mmol), MeOH (20 g, 625 mmol) and THF (25 g). The mixture was allowed to stir for about 1 to 3 hr at 60-70° C., then the polymer solution obtained in Example 15 (half the portion of about 25 g of solid polymer in 28 g toluene) was added, and maintained at 60-70° C. After about 15 hr of the reaction at 70° C., the mixture was cooled to room temperature. The reaction mixture was then acidified with aqueous conc. hydrochloric acid (15 g), and then washed five to seven times (100 mL each wash) to remove residual salts and acid. Adequate amount of THF (10-30 mL) was added during each wash to facilitate the phase separation. The organic phase was separated and the polymer was precipitated in hexanes (about 3 to 10 fold excess). The resulting solid was re-dissolved in THF and precipitated in excess hexanes. This procedure was repeated. The solid polymer was finally separated by filtration and dried in a vacuum oven at 50-60° C. for 15 hr. The yield was calculated based on the conversion with MeOH and based on the conversion and monomer content as calculated in Example 15. Approximately 12 g (50%) of the ROMA polymer of BuDMMINB/MA with MeOH was isolated.

Comparative Example 1

PENB/MA Copolymer

Maleic Anhydride (MA, 16.7 g, 170 mmol), PENB (33.7 g, 3170 mmol) and AIBN (2.79 g, 17.0 mmol) was dissolved in toluene (48 g) and charged to an appropriately sized reaction vessel. The solution was sparged with nitrogen for 30 min to remove oxygen and then heated with stirring to 70° C. The mixture was allowed to stir at 70° C. for 24 hr, after which the solution was cooled to room temperature. (GPC (THF) Mw=8400 Mn=4300).

Comparative Example 2

ROMA Polymer of PENB/MA of Comparative Example 1

An appropriately sized reaction vessel was loaded with NaOH (6.2 g, 155 mmol), BuOH (40 g, 540 mmol) and THF (30 g). The mixture was allowed to stir for about 1 to 3 hr at 60-70° C., then an aliquot (80 g) of the polymer solution obtained in Comparative Example 1 that was mixed with THF (50 g) was added, and maintained at 60-70° C. After about 15 hr of the reaction at 70° C., the mixture was cooled to room temperature. The reaction mixture was then protonated with aqueous conc. hydrochloric acid (30 g), and then washed five to seven times (100 mL each wash) to remove residual salts and acid. Adequate amount of THF (10-30 mL) was added during each wash to facilitate the phase separation. The organic phase was separated and the polymer was precipitated in hexanes (about 3 to 10 fold excess). The resulting solid was re-dissolved in THF and the precipitation in excess hexanes was repeated two more times. The solid polymer was finally separated by filtration and dried in a vacuum oven at 50-60° C. for 15 hr. The isolated ring-opened polymer with BuOH was characterized by GPC (THF) (Mw=14,900 Mn=4,150), FT-IR (which confirmed ring opening of the maleic anhydride as evidenced by the disappearance of anhydride carbonyl absorption peaks at 1774 and 1853 $cm^{-1}$), and $^{13}$C-NMR.

Example 31

Formulation of Polymer Compositions of ROMA-MI Polymers (Hereinafter Referred to as "FP")

The ROMA-MI polymers obtained in Examples 16 to 30 were formulated into various polymer compositions/formulations of this invention using one of the following protocols:
- (A) ROMA-MI polymers of Examples 16-30 were dissolved in NMP to form 20 to 25 wt. % solution, and used as such. These compositions contained no other additives.
- (B) ROMA-MI polymers of Examples 16-30 (5 parts by weight), TrisP 3M6C-2-201 (1.25 parts by weight, from Toyo Gosei) and TMPTGE (4 parts by weight) were dissolved in NMP to form 20 to 25 wt. % solution (based on total solid content).
- (C) ROMA-MI polymers of Examples 16-30 (10 parts by weight) and TrisP 3M6C-2-201 (3 parts by weight, from Toyo Gosei) were dissolved in NMP to form 20 to 25 wt. % solution (based on total solid content).
- (D) ROMA-MI polymers of Examples 16-30 (10 parts by weight) and TrisP 3M6C-2-201 (4 parts by weight, from Toyo Gosei) were dissolved in NMP to form 20 to 25 wt. % solution (based on total solid content).

(E) ROMA-MI polymers of Examples 16-30 (10 parts by weight), TrisP 3M6C-2-201 (3 parts by weight, from Toyo Gosei) and TMPTGE (2 parts by weight) were dissolved in NMP to form 20 to 25 wt. % solution (based on total solid content).
(F) ROMA-MI polymers of Examples 16-30 (10 parts by weight), TrisP 3M6C-2-201 (4 parts by weight, from Toyo Gosei) and TMPTGE (2 parts by weight) were dissolved in NMP to form 20 to 25 wt. % solution (based on total solid content).
(G) ROMA-MI polymers of Examples 16-30 (100 parts by weight) and CPTX (0.5 parts by weight, from Lambson) were dissolved in NMP to form 20 to 25 wt. % solution (based on total solid content).
(H) ROMA-MI polymers of Examples 16-30 (100 parts by weight) and CPTX (1 part by weight, from Lambson) were dissolved in NMP to form 20 to 25 wt. % solution (based on total solid content).
(I) ROMA-MI polymers of Examples 16-30 (100 parts by weight), CPTX (1 part by weight, from Lambson) and TMPTGE (20 parts by weight) were dissolved in NMP to form 20 to 25 wt. % solution (based on total solid content).
(J) ROMA-MI polymers of Examples 16-30 (10 parts by weight), TrisP 3M6C-2-201 (2.5 parts by weight, from Toyo Gosei) and TMPTGE (2 parts by weight) were dissolved in NMP to form 20 to 25 wt. % solution (based on total solid content).

Example 32

Spin Coating Procedures

The polymer compositions made in accordance with one of the protocols set forth in Example 31 were spun coated on to a suitable substrate using one of the following spin protocols (hereinafter referred to as "SP"):
(A) A formulation of Example 31 was spun onto a suitable substrate such as 4 inch glass substrates or a silicon wafer at 500 rpm for 40 seconds;
(B) A formulation of Example 31 was spun onto a suitable substrate such as 4 inch glass substrates or a silicon wafer first at 500 rpm for 10 seconds and then at 800 rpm for 30 seconds;
(C) A formulation of Example 31 was spun onto a suitable substrate such as 4 inch glass substrates or a silicon wafer at 500 rpm for 10 seconds and then at 1000 rpm for 30 seconds; and
(D) A formulation of Example 31 was spun onto a suitable substrate such as 4 inch glass substrates or a silicon wafer at 500 rpm for 10 seconds and then at 2000 rpm for 30 seconds.

Example 33

Post Apply Bake (PAB) Protocols

The spun coated samples from Example 32 were post-apply baked
(hereinafter referred to as "PAB") using any one of the following four procedures:
(A) 100° C./1 min; (B) 110° C./3 min; (C) 130° C./2 min; (D) 130° C./3 min.

Example 34

Post Exposure Bake (PEB) Protocols

The PAB samples from Example 33 were suitably exposed to suitable actinic radiation and after which time was baked, if needed, using one of the following three procedures: (A) none; (B) 100° C./2 min; (C) 120° C./2 min

Example 35

Cure Protocols

The spun coated film samples formed in accordance with the procedures set forth in one of Examples 32 through 34 were baked, if needed, on a hot plate in air or in an oven under nitrogen atmosphere to remove residual solvents from the films or to obtain thermally cured films or to apply thermal stress to the films. Any one of the following cure protocols was used: (A) 200° C./60 min; (B) 220° C./60 min; and (C) 250° C./30 min.

Example 36

Aqueous Base Development

The spun coated substrates as obtained in Examples 32 through 34 were imagewise exposed to a suitable actinic radiation either using a patterned mask or without a mask and then developed as follows. The exposed spun coated substrate was immersed in developer (0.4 wt. % or 2.38 wt. % TMAH) for various times (immersion development). The unexposed area film thickness loss or dark field loss (DFL) of the films that were formulated for positive tone (PT) image development was determined by measuring the film thicknesses before and after development in an unexposed region of the film and reported as percent loss of the film thickness in areas of the film that was not exposed to the radiation. For films that were formulated for negative tone (NT) image development, the exposed area film thickness loss (EFTL) was measured similarly as percent loss of the film thickness in areas of the film that was exposed to the radiation.

Example 37

Transparency Measurements (% T)

The polymer Examples 16 through Example 30 were formulated into polymer compositions using one of the procedures set forth in Example 31 (FP, A through I). The formulations so formed were spun onto 4" glass substrates using one of the procedures as set forth in Example 32 (SP, A through D) and post apply baked (PAB) in accordance with one of the procedures set forth in Example 33 (PAB, A through D) to obtain a polymer film of about 3 microns, then exposed at 1 J/cm$^2$ (at 365 nm) using a broad band Hg vapor light source (g, h and i bands, flood exposure at 365 nm using a band pass filter). After exposure, the glass substrate coated with the film was subjected to one of the cure protocols set forth in Example 35 (A, B or C) on a hot plate in air, and the transparency (% T) of the film at 400 nm wavelength was measured by using Cary 100 UV-Visible Spectrophotometer. The results of transparency measurements are summarized in Table 5.

TABLE 5

| Polymer Ex # | Ex. 31 (FP) | Ex. 32 (SP) | Ex. 33 (PAB) | % T after PEB (A) | % T after Cure (B) | % T after Cure (C) |
|---|---|---|---|---|---|---|
| 18 | A | A | A | 99 | — | 84 |
| 18 | C | A | A | 89 | — | 46 |
| 22 | A | A | A | 100 | — | 92 |

TABLE 5-continued

| Polymer Ex # | Ex. 31 (FP) | Ex. 32 (SP) | Ex. 33 (PAB) | % T after PEB (A) | % T after Cure (B) | % T after Cure (C) |
|---|---|---|---|---|---|---|
| 22 | C | A | A | 94 | — | 71 |
| 16 | A | A | A | 99 | — | 98 |
| 16 | C | A | A | 93 | — | 75 |
| 21 | A | A | A | 99 | — | 85 |
| 21 | C | A | A | 93 | — | 69 |
| 17 | A | A | D | 100 | 91 | — |
| 19 | A | A | D | 100 | 94 | — |
| 28 | A | A | D | 97 | 92 | — |
| 28 | C | B | D | 86 | 75 | — |
| 26 | A | A | D | 98 | 92 | — |
| 26 | C | B | D | 86 | 76 | — |
| 24 | A | A | D | 99 | 93 | — |
| 24 | C | B | D | 86 | 72 | — |
| 23 | A | A | D | 98 | 95 | — |
| 23 | C | B | D | 85 | 75 | — |

It is evident from the data presented in Table 5, several of the Examples of 16 through 30, i.e., the ROMA-MI polymers of this invention exhibit excellent transparency even after exposure to an actinic radiation.

Example 38

Thermal Weight Loss Studies (TGA Weight Loss)

The polymer Examples 16 through Example 30 were formulated into polymer compositions using one of the procedures set forth in Example 31 (FP, A through I). The formulations so formed were spun onto 4 inch thermal oxide silicon wafer using one of the procedures as set forth in Example 32 (SP, A through D) and post apply baked (PAB) in accordance with one of the procedures set forth in Example 33 (PAB, A through D) to obtain a polymer film of about 3 microns, then exposed at 1 J/cm² (at 365 nm) using a broad band Hg vapor light source (g, h and i bands, flood exposure at 365 nm using a band pass filter). After exposure, the wafer was baked in an oven at 200° C. for 60 min (cure protocol A of Example 35) under nitrogen atmosphere to remove residual solvents from the film. The film was removed from the wafer and isothermal TGA was run at 250° C. for 60 minutes in nitrogen atmosphere. The weight loss results are summarized in Table 6.

TABLE 6

| Polymer Ex # | Ex. 31 (FP) | Ex. 32 (SP) | Ex. 33 (PAB) | % wt. loss (250° C./1 hr) |
|---|---|---|---|---|
| 18 | A | A | A | 4 |
| 18 | D | A | A | 2 |
| 22 | A | A | A | 7 |
| 22 | D | A | A | 3 |
| 16 | A | A | A | 9 |
| 16 | D | A | A | 3 |
| 21 | A | A | A | 8 |
| 21 | D | A | A | 3 |
| 17 | E | A | D | 4 |
| 19 | E | A | D | 4 |
| 28 | A | A | D | 4 |
| 26 | A | A | D | 5 |
| 26 | E | A | D | 5 |
| 24 | A | A | D | 4 |
| 24 | E | A | D | 4 |
| 23 | A | A | D | 5 |
| 23 | E | A | D | 6 |

It is evident from the data presented in Table 6, several of the Examples of 16 through 30, i.e., the ROMA-MI polymers of this invention exhibit excellent thermal properties having retained greater than 90 percent of weight at 250° C.

Example 39

Photo Imaging Studies

Several of the polymer Examples 16 through Example 30 were formulated into polymer compositions using one of the procedures set forth in Example 31 (FP, A through I). The formulations so formed were spun onto 4 inch thermal oxide silicon wafer using one of the procedures as set forth in Example 32 (SP, A through D) and post apply baked (PAB) in accordance with one of the procedures set forth in Example 33 (PAB, A through D) to obtain a polymer film of about 3 microns. After exposure the wafer was subjected post exposure bake (PEB) using one of the procedures set forth in Example 34 and developed in accordance with the procedures set forth in Example 36 using either 0.4 wt. % or 0.2 wt. % TMAH developer. The results are summarized in Tables 7 and 8.

TABLE 7

| Polymer Ex # | Ex. 31 (FP) | Ex. 32 (SP) | Ex. 33 (PAB) | FT (μm) | EXD (mj/cm²) | DFL (%) | Develop 0.4% TMAH | Resolution |
|---|---|---|---|---|---|---|---|---|
| 18 | D | A | A | 1.30 | 194 | 4% | 30 sec | 5 um CH and L/S |
| 22 | D | A | A | 3.28 | 306 | 2% | 60 sec | 5 um CH and L/S |
| 16 | D | A | A | 2.87 | 194 | 9% | 20 sec | 10 um CH |
| 17 | E | C | D | 2.61 | 306 | 2% | 180 sec | 5 um CH and 3 um L/S |
| 28 | C | A | C | — | 72 | — | 120 sec | 10 um CH and L/S |
| 26 | C | A | C | 3.71 | 194 | 1% | 45 sec | 5 um CH and L/S Film cracked |
| 24 | C | A | C | 4.13 | 502 | 2% | 90 sec | 10 um CH and L/S |
| 23 | C | A | C | 2.18 | 72 | 40% | 30 sec | 5 um CH, 2 um L/S, film cracked |
| 29 | E | C | D | 2.05 | 944 | — | 1200 sec | 10 um CH and 3 um L/S |
| 30 | D | A | D | 2.94 | 194 | 0.5% | 90 sec | 10 um CH and 5 um L/S |

The exposure dose (EXD) is reported in mJ/cm², where such is reflective of both the energy of a broad band Hg-vapor light source used to expose (at 365 nm using a band pass filter) the sample and the time of that exposure; and post apply bake (PAB) and post exposure bake (PEB) reported reflect the total time at the indicated temperature according to the protocols of Example 33 and Example 34 respectively. The PAC employed in this Example was TrisP-2 3M6C-2-201; the photosensitizer (S) employed was CPTX; and the cross-linker used was TMPTGE (CL-1) as summarized in Tables 7 and 8.

FIGS. 1-3 show lithographic photoimages obtained for the formulations as described above. These images show both the contact holes (FIGS. 1A, 2A and 3A) and the lines/spaces (FIGS. 1B, 2B and 3B). Turning specific to FIGS. 1 and 2 are for the positive tone formulations respectively of polymer Example 17 (FIG. 1) and polymer Example 30 (FIG. 2). FIG. 3 shows lithographic photoimages of negative tone formulations of polymer Example 30. These micrographs clearly demonstrate that various polymers of this invention can both be used as positive as well as negative tone formulations exhibiting various superior properties as described herein.

TABLE 8

| Polymer Ex # | Ex. 31 (FP) | Ex. 32 (SP) | Ex. 33 (PAB) | EX. 34 (PEB) | FT (μm) | EXD | DFL | Develop (%) TMAH | Resolution |
|---|---|---|---|---|---|---|---|---|---|
| 18 | G | A | B | C | 1.75 | 976 | 12% gain | 80 sec (0.4%) | 10 um CH and 2 μm L/S |
| 17 | H | C | D | C | 1.32 | 944 | 6% loss | 15 sec (0.4%) | 10 μm CH and 5 μm L/S |
| 17 | 1 | A | D | B | 3.37 | 791 | 5% gain | 60 sec (0.2%) | 5 um CH |
| 16 | G | A | B | C | 1.71 | 710 | 22% gain | 80 sec (0.4%) | 10 um CH |
| 19 | H | C | D | C | 1.75 | 306 | 6% gain | 120 sec (0.4%) | 10 um CH and L/S |
| 30 | G | A | B | C | 3.89 | 502 | 15% gain | 30 sec (0.4%) | 25 μm CH and 10 μm L/S |

FT-film thickness; EXD-Exposure dose; DFL-dark field loss; CH-contact holes; L/S-lines/spaces Example 40

Film Curing Studies

A few of the polymer Examples 16 through Example 30 were formulated into polymer compositions using one of the procedures set forth in Example 31 (FP, A through I). The formulations so formed were spun onto 4 inch thermal oxide silicon wafer using one of the procedures as set forth in Example 32 (SP, A through D) and post apply baked (PAB) in accordance with one of the procedures set forth in Example 33 (PAB, protocol D) at 130° C./3 min to obtain a polymer film of about 1-6 microns, then exposed at 1 J/cm² using a mask aligner having a broad band Hg vapor light source (g, h and i bands) at 365 nm using a band pass filter. After exposure, the wafer was baked in an oven at 220° C. for 60 min (Example 35, PEB, cure protocol B) under nitrogen atmosphere to obtain a cured film. The wafer was then soaked into NMP at 40° C. for 10 minutes. NMP was used to determine the extent of cure of the films since the original polymers and formulations were soluble in that solvent. A final bake at 130° C./3 min was also applied to the film to remove any residual NMP absorbed into the film during NMP soak (Example 35, PEB-2). Film thicknesses (FT) of the films were measured after each of the following steps: PAB, PEB-1, after NMP immersion and PEB-2. The results of these NMP resistance experiments including the percent change of the film thicknesses upon NMP soak (before PEB-2) are summarized in Table 9.

TABLE 9

| Polymer Ex # | Ex. 31 (FP) | FT after PAB μm | FT after PEB-1 μm | FT after NMP μm | FT after PEB-2 μm | % FT change after NMP |
|---|---|---|---|---|---|---|
| 17 | A | 1.71 | 1.54 | 1.59 | 1.48 | +3% |
| 17 | E | 3.41 | 3.10 | 3.52 | 3.26 | +14% |
| 19 | A | 3.00 | 2.46 | 3.31 | 2.85 | +34% |
| 19 | E | 5.44 | 4.91 | 5.31 | 4.94 | +8% |
| 26 | A | 2.16 | 1.97 | 1.54 | 1.32 | −22% |
| 26 | E | 3.94 | 3.37 | 3.82 | 3.60 | +13% |
| 24 | A | 3.88 | 2.65 | Film peeled off | — | — |
| 24 | E | 5.24 | 4.77 | 5.72 | 5.15 | +12% |
| 23 | A | 3.11 | 2.61 | Film peeled off | — | — |
| 23 | E | 5.39 | 4.90 | 5.50 | 4.99 | +20% |

It is evident form the data presented in Table 9 that the polymers of this invention are suitable both as negative tone and positive tone formulations as indicated from their ability to photo-cure or thermal-cure with or without any added crosslinking and/or photoactive compounds/agents.

Example 41

Photo Curing Studies

Polymer Example 19 was formulated using the procedures of Example 31, protocol A and was spun onto 4 inch thermal oxide silicon wafer and post apply baked (Example 33, PAB procedure D) at 130° C./3 min to obtain a polymer film of about 7.70 microns (Example 41-1). The wafer was cleaved in half and one half (Example 41-2) was then exposed at 1 J/cm² using a mask aligner having a broad band Hg vapor light source (g, h and i bands) at 365 nm using a band pass filter. Both films were immersed in NMP for 1 minute at ambient temperature followed by film thickness measurements. The film thickness of the unexposed half of the wafer (41-1) was zero microns while the exposed half (41-2) was 5.68 microns indicating about 74% of film retention.

Polymer Examples 18 and 16 were formulated using the procedures of Example 31, protocol G and were spun onto 4 inch thermal oxide silicon wafer and post apply baked (Example 33, PAB procedure A) at 100° C./1 min to obtain respectively a polymer film of about 2.53 microns (Example 41-3 from polymer example 18) and 3.39 microns (Example 41-4 from polymer example 16). The films were then exposed at 1 J/cm² using a mask aligner having a broad band Hg vapor light source (g, h and i bands) at 365 nm using a band pass filter. The films were immersed in NMP for 1 minute at ambient temperature followed by film thickness measurement. The film thickness of the NMP immersed film in wafer (Example 41-3) was 1.52 microns indicating about 60% of film retention and the film thickness of NMP immersed film in wafer (Example 41-4) was 0.51 microns indicating about 15% of the film retention has occurred when formulated with CPTX, a photo-sensitizer.

Polymer Examples 18 and 16 were formulated using the procedures of Example 31, protocol C and were spun onto 4 inch thermal oxide silicon wafer and post apply baked (Example 33, PAB procedure A) at 100° C./1 min to obtain respectively a polymer film of 2.50 microns (Example 41-5 from polymer example 18) and 3.54 microns (Example 41-6 from polymer example 16). The wafers were then exposed at 1 J/cm² using a mask aligner having a broad band Hg vapor light source (g, h and i bands) at 365 nm using a band pass filter. The films were immersed in NMP for 1 minute at ambient temperature followed by film thickness measurements. The film thickness of the NMP immersed wafers were zero microns for both films indicating no photo-curing has occurred when formulated with TrisP-2 3M6C-2-201, a PAC capable of affecting positive tone imaging upon exposure to a light source.

The formulations of polymer Examples 17 (Example 31, formulation protocol A (Example 41-7) and modified formulation protocol B where TMPTGE was omitted (Example 41-8)) were spun onto 4" glass substrates and post apply baked (Example 33, PAB protocol D) to obtain a polymer films of about 1-3 microns. The UV-VIS absorption spectra of Example 41-7 and Example 41-8 films were recorded using Cary 100 UV-Visible Spectrophotometer and shown in FIG. 4 ((normalized to 1 micron film thickness for comparison). As can be seen by FIG. 4 the presence of 25Phr TRisP-2 causes considerable increase in absorbance at 365 nm wavelength. For example the absorbance of 41-7 at 365 nm at 1 micron film thickness is 0.006 while the absorbance of 41-8 at 1 micron film thickness is 0.325. This perhaps explains the aforementioned inability of photo curing of the films of Example 41-7 and Example 41-8 since most of the light energy is absorbed by TrisP-2 additive.

Example 42

Thermal Curing Studies

Polymer Example 18 was formulated using the formulation procedure set forth in Example 30, protocol A. For comparative purposes, Comparative Polymer Example 2 was also formulated using the same formulation procedure set forth in Example 30, protocol A. Both formulation samples were then spun onto 4 inch thermal oxide silicon wafer and post apply baked (Example 33, PAB procedure D) at 130° C./3 min. The film thicknesses were measured and the films were heated to 220° C. for 1 hour in an oven in nitrogen atmosphere. The films were immersed in NMP for 10 minutes at 40° C. temperature each followed by film thicknesses were measured. The film thickness of the formulation of polymer Example 18 changed from 7.70 microns to 6.18 microns (20% film thickness loss) upon NMP immersion indicating the film was thermally cured (Example 42-1). Whereas the film thickness of the formulation of the polymer from Comparative Example 2 changed from 1.17 microns to zero microns (100% film thickness loss) upon NMP immersion indicating no thermal curing has occurred (Example 42-2). This clearly demonstrates the superior performance ability of the polymers of this invention.

Example 43

Dielectric Constant Measurements

The polymer Examples 16 through Example 30 were formulated into polymer compositions using the procedures set forth in Example 31, protocol A by dissolving in NMP (FP, formulation protocol A), with TrisP 3M6C-2-201 (25 wt. % based on the polymer weight, from Toyo Gosei) with TMPTGE (80 wt. % based on the polymer weight) (FP, formulation protocol B) or with TrisP 3M6C-2-201 (25 wt. % based on the polymer weight, from Toyo Gosei) and with TMPTGE (20 wt. % based on the polymer weight) (FP, formulation protocol J). The formulations were spun onto an aluminum plate (200 um thickness, 100 mm×100 mm) at 300 rpm for 23 sec, soft baked at 110° C. for 100 sec to obtain polymer films of about 3 microns, then exposed at 500 mJ/cm2 using a mask aligner having a broad band Hg vapor light source (g, h and i bands). After exposure, the wafers were post-exposure baked at 220° C. for 60 min under nitrogen atmosphere to obtain cured films. The dielectric constants of the films were measured following the technique of JIS-K6911, a Japanese Industrial Standard. The film thicknesses were measured by using Dainippon Screen MFG CO., LTD. Lambda ace VM-1020. The results of these dielectric constant measurements are summarized in table 10.

TABLE 10

| Polymer Example # | Ex. 31 (FP) | Dielectric Constant | | | |
|---|---|---|---|---|---|
| | | 1 kHz | 10 kHz | 100 kHz | 1 MHz |
| 18 | J | 3.4 | 3.3 | 3.3 | 3.2 |
| 22 | J | 3.5 | 3.4 | 3.4 | 3.3 |
| 16 | J | 4.0 | 3.9 | 3.9 | 3.7 |
| 21 | J | 3.7 | 3.7 | 3.6 | 3.4 |
| 28 | A | 3.3 | 3.2 | 3.1 | 3.0 |
| 28 | B | 4.1 | 4.0 | 3.9 | 3.7 |
| 24 | A | 3.2 | 3.1 | 3.1 | 3.0 |
| 24 | B | 3.9 | 3.9 | 3.8 | 3.7 |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:
1. A polymer comprising:
 a first type of repeating unit represented by formula (IA), said first type of repeating unit is derived from a monomer of formula (I):

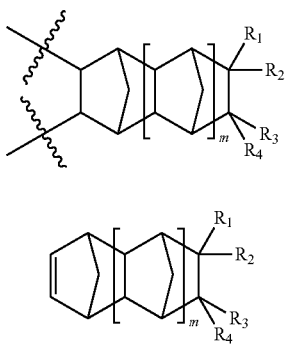

(IA)

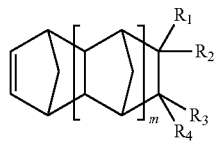

(I)

wherein:

m is an integer 0, 1 or 2;

to at least one of $R_1$, $R_2$, $R_3$ and $R_4$ independently represents a group of formula (A):

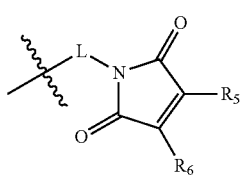

(A)

wherein:

L represents $(CH_2)_n$, $CH_2OCH_2CH_2$, $OCH_2$, $O(CH_2)_o$—$OCH_2$, $(OCH_2CH_2)_p$, $(CH_2)_n$—CO—O, $(CH_2)_n$-phenylene, phenylene, where n and p independently are integers from 0 to 15 inclusive and o is an integer from 1 to 15 inclusive; and $R_5$ and $R_6$ are each independently of one another hydrogen or linear or branched $(C_1$-$C_6)$alkyl; or $R_5$ and $R_6$ taken together with the carbon atom to which they are attached form a $(C_5$-$C_7)$cycloalkyl or $(C_6$-$C_{12})$bicycloalkyl ring;

remaining one or more of $R_1$, $R_2$, $R_3$ and $R_4$ independently represents hydrogen, linear or branched $(C_1$-$C_{12})$alkyl, hydroxy$(C_1$-$C_{12})$alkyl, perfluoro$(C_1$-$C_{12})$alkyl, $(C_3$-$C_{12})$cycloalkyl, $(C_6$-$C_{12})$bicycloalkyl, $(C_7$-$C_{14})$tricycloalkyl, $(C_6$-$C_{10})$aryl, $(C_6$-$C_{10})$aryl$(C_1$-$C_3)$alkyl, perfluoro$(C_6$-$C_{10})$aryl, perfluoro$(C_6$-$C_{10})$aryl$(C_1$-$C_3)$alkyl, $(C_5$-$C_{10})$heteroaryl, $(C_5$-$C_{10})$heteroaryl$(C_1$-$C_3)$alkyl, hydroxy, $(C_1$-$C_{12})$alkoxy, $(C_3$-$C_{12})$cycloalkoxy, $(C_6$-$C_{12})$bicycloalkoxy, $(C_7$-$C_{14})$tricycloalkoxy, $(C_6$-$C_{10})$ aryloxy$(C_1$-$C_3)$alkyl, $(C_5$-$C_{10})$heteroaryloxy$(C_1$-$C_3)$ alkyl, $(C_6$-$C_{10})$aryloxy, $(C_5$-$C_{10})$heteroaryloxy, $(C_1$-$C_6)$ acyloxy and halogen; and a second type of repeating unit represented by formula (IIA) or (IIB), said second type of repeating unit is derived from a monomer of formula (II):

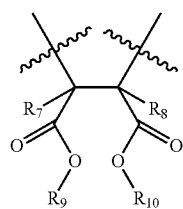

(IIA)

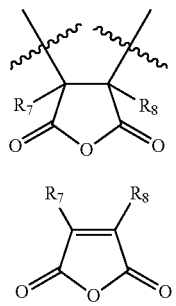

(IIB)

(II)

wherein:

$R_7$, $R_8$, $R_9$ and $R_{10}$ are each independently of one another hydrogen or linear or branched $(C_1$-$C_9)$alkyl, fluorinated or perfluorinated$(C_1$-$C_9)$alkyl, $(C_1$-$C_{12})$alkoxy$(C_1$-$C_{12})$ alkyl or $(C_1$-$C_{12})$alkoxy$(C_1$-$C_{12})$alkoxy$(C_1$-$C_{12})$alkyl; and wherein each of aforementioned groups, where valence is permissible, is optionally substituted with one or more groups selected from linear or branched $(C_1$-$C_6)$alkyl, $(C_3$-$C_7)$cycloalkyl, $(C_1$-$C_6)$perfluoroalkyl, $(C_1$-$C_6)$ alkoxy, $(C_3$-$C_7)$cycloalkoxy, $(C_1$-$C_6)$perfluoroalkoxy, halogen, hydroxy, linear or branched hydroxy$(C_1$-$C_6)$ alkyl, acetoxy, phenyl, hydroxyphenyl and acetoxyphenyl.

2. The polymer according to claim 1 further comprising a third type of repeating unit represented by formula (IIIA), said third type of repeating unit is derived from a monomer of formula (III):

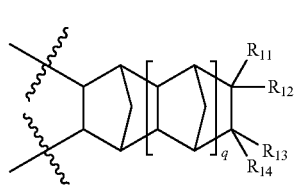

(IIIA)

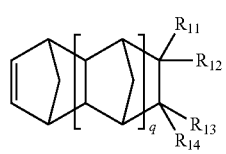

(III)

wherein:

q is an integer 0, 1 or 2;

$R_{11}$, $R_{12}$, $R_{13}$ and $R_{14}$ independently represents hydrogen, linear or branched $(C_1$-$C_{12})$alkyl, perfluoro$(C_1$-$C_{12})$ alkyl, $(C_3$-$C_{12})$cycloalkyl, $(C_6$-$C_{12})$bicycloalkyl, $(C_7$-$C_{14})$tricycloalkyl, $(C_6$-$C_{10})$aryl, perfluoro$(C_6$-$C_{10})$aryl, perfluoro$(C_6$-$C_{10})$aryl$(C_1$-$C_3)$alkyl, $(C_5$-$C_{10})$heteroaryl, $(C_5$-$C_{10})$heteroaryl$(C_1$-$C_3)$alkyl, hydroxy, $(C_1$-$C_{12})$alkoxy, $(C_3$-$C_{12})$cycloalkoxy, $(C_6$-$C_{12})$bicycloalkoxy, $(C_7$-$C_{14})$tricycloalkoxy, $(C_6$-$C_{10})$aryloxy $(C_1$-$C_3)$alkyl, $(C_5$-$C_{10})$heteroaryloxy$(C_1$-$C_3)$alkyl, $(C_6$-$C_{10})$aryloxy, $(C_5$-$C_{10})$heteroaryloxy, $(C_1$-$C_6)$acyloxy and halogen.

3. The polymer according to claim 1, wherein m is 0, $R_1$ is a group of formula (A) where L is $(CH_2)$, or $(CH_2)_n$-phenylene, where n is an integer from 1 to 10, inclusive; $R_2$, $R_3$ and $R_4$ are each hydrogen; each $R_5$ and $R_6$ independently of one another is hydrogen or methyl; $R_7$ and $R_8$ are hydrogen; each $R_9$ and $R_{10}$ independently of one another is hydrogen, methyl or n-butyl.

4. The polymer according to claim 2, wherein m is 0, $R_1$ is a group of formula (A) where L is ($CH_2$), or ($CH_2$)$_n$-phenylene, where n is an integer from 1 to 10, inclusive; $R_2$, $R_3$ and $R_4$ are each hydrogen; q is 0 or 1; each $R_5$ and $R_6$ independently of one another is hydrogen or methyl; $R_7$ and $R_8$ are hydrogen; each $R_9$ and $R_{10}$ independently of one another is hydrogen, methyl or n-butyl; and $R_{11}$ and $R_{12}$ are independently of each other selected from hydrogen, perfluoro($C_1$-$C_5$)alkyl, pentafluorophenyl and pentafluorophenylmethyl.

5. The polymer according to claim 1, wherein said first repeating unit is derived from a monomer selected from the group consisting of:
   1-(bicyclo[2.2.1]hept-5-en-2-ylmethyl)-3,4-dimethyl-1H-pyrrole-2,5-dione;
   1-(2-(bicyclo[2.2.1]hept-5-en-2-yl)ethyl)-3,4-dimethyl-1H-pyrrole-2,5-dione;
   1-(3-(bicyclo[2.2.1]hept-5-en-2-yl)propyl)-3,4-dimethyl-1H-pyrrole-2,5-dione;
   1-(4-(bicyclo[2.2.1]hept-5-en-2-yl)butyl)-3,4-dimethyl-1H-pyrrole-2,5-dione;
   1-(6-(bicyclo[2.2.1]hept-5-en-2-yl)hexyl)-3-methyl-1H-pyrrole-2,5-dione;
   1-(9-(bicyclo[2.2.1]hept-5-en-2-yl)nonyl)-3-methyl-1H-pyrrole-2,5-dione;
   1-(12-(bicyclo[2.2.1]hept-5-en-2-yl)dodecyl)-3-methyl-1H-pyrrole-2,5-dione;
   1-(15-(bicyclo[2.2.1]hept-5-en-2-yl)pentadecyl)-3-methyl-1H-pyrrole-2,5-dione;
   1-(bicyclo[2.2.1]hept-5-en-2-ylmethyl)-3-methyl-1H-pyrrole-2,5-dione;
   1-(6-(bicyclo[2.2.1]hept-5-en-2-yl)hexyl)-3-methyl-1H-pyrrole-2,5-dione;
   1-(12-(bicyclo[2.2.1]hept-5-en-2-yl)dodecyl)-3-methyl-1H-pyrrole-2,5-dione;
   1-(15-(bicyclo[2.2.1]hept-5-en-2-yl)pentadecyl)-3-methyl-1H-pyrrole-2,5-dione;
   1-(bicyclo[2.2.1]hept-5-en-2-ylmethyl)-1H-pyrrole-2,5-dione;
   1-(2-(bicyclo[2.2.1]hept-5-en-2-yl)ethyl)-1H-pyrrole-2,5-dione;
   1-(4-(2-(bicyclo[2.2.1]hept-5-en-2-yl)ethyl)phenyl)-3,4-dimethyl-1H-pyrrole-2,5-dione;
   2-(bicyclo[2.2.1]hept-5-en-2-ylmethyl)-4,5-dihydro-1H-benzo[e]isoindole-1,3(2H)-dione;
   2-(bicyclo[2.2.1]hept-5-en-2-ylmethyl)-1H-benzo[e]isoindole-1,3(2H)-dione;
   2-(bicyclo[2.2.1]hept-5-en-2-ylmethyl)isoindoline-1,3-dione;
   2-(bicyclo[2.2.1]hept-5-en-2-ylmethyl)hexahydro-1H-isoindole-1,3(2H)-dione;
   1-((bicyclo[2.2.1]hept-5-en-2-yloxy)methyl)-3,4-dimethyl-1H-pyrrole-2,5-dione;
   1-(((((bicyclo[2.2.1]hept-5-en-2-yloxy)methoxy)methoxy)methyl)-3-methyl-1H-pyrrole-2,5-dione;
   1-(2-(2-(bicyclo[2.2.1]hept-5-en-2-yloxy)ethoxy)ethyl)-3,4-dimethyl-1H-pyrrole-2,5-dione; and
   1-(4-(bicyclo[2.2.1]hept-5-en-2-yl)phenyl)-3,4-dimethyl-1H-pyrrole-2,5-dione.

6. The polymer according to claim 1, wherein said second repeating unit is derived from a monomer selected form the group consisting of:
   maleic anhydride;
   2-methyl-maleic anhydride (3-methylfuran-2,5-dione);
   2,3-dimethyl-maleic anhydride (3,4-dimethylfuran-2,5-dione);
   2-ethyl-maleic anhydride (3-ethylfuran-2,5-dione);
   2,3-diethyl-maleic anhydride (3,4-diethylfuran-2,5-dione);
   2-trifluoromethyl-maleic anhydride (3-trifluoromethylfuran-2,5-dione);
   2,3-bis(trifluoromethyl)-maleic anhydride (3,4-bis(trifluoromethyl)furan-2,5-dione); and
   2-methyl-3-trifluoromethyl-maleic anhydride (3-methyl-4-(trifluoromethyl)furan-2,5-dione).

7. The polymer according to claim 2, wherein said third repeating unit is derived from a monomer selected form the group consisting of:
   5-decylbicyclo[2.2.1]hept-2-ene;
   5-perfluorobutylbicyclo[2.2.1]hept-2-ene;
   5-pentafluorobenzylbicyclo[2.2.1]hept-2-ene;
   5-pentafluorophenylbicyclo[2.2.1]hept-2-ene;
   1,2,3,4,4a,5,8,8a-octahydro-1,4:5,8-dimethanonaphthalene; and
   5-((perfluorophenyl)methyl)bicyclo[2.2.1]hept-2-ene.

8. The polymer according to claim 1, wherein said first repeat unit is derived from:
   1-(bicyclo[2.2.1]hept-5-en-2-ylmethyl)-3,4-dimethyl-1H-pyrrole-2,5-dione;
   1-(4-(bicyclo[2.2.1]hept-5-en-2-yl)butyl)-3,4-dimethyl-1H-pyrrole-2,5-dione; and
   1-(9-(bicyclo[2.2.1]hept-5-en-2-yl)nonyl)-3,4-dimethyl-1H-pyrrole-2,5-dione; and
   said second repeat unit is derived from maleic anhydride.

9. The polymer according to claim 1, wherein said first repeat unit is derived from:
   1-(bicyclo[2.2.1]hept-5-en-2-ylmethyl)-3,4-dimethyl-1H-pyrrole-2,5-dione;
   1-(4-(bicyclo[2.2.1]hept-5-en-2-yl)butyl)-3,4-dimethyl-1H-pyrrole-2,5-dione; and
   1-(9-(bicyclo[2.2.1]hept-5-en-2-yl)nonyl)-3,4-dimethyl-1H-pyrrole-2,5-dione; and
   said second repeat unit is derived from maleic anhydride; and
   said third repeat unit is derived from:
   5-perfluorobutylbicyclo[2.2.1]hept-2-ene;
   5-pentafluorophenylbicyclo[2.2.1]hept-2-ene; and
   1,2,3,4,4a,5,8,8a-octahydro-1,4:5,8-dimethanonaphthalene.

10. A layer forming polymer composition comprising:
   a polymer comprising:
   a first type of repeating unit represented by formula (IA), said first type of repeating unit is derived from a monomer of formula (I):

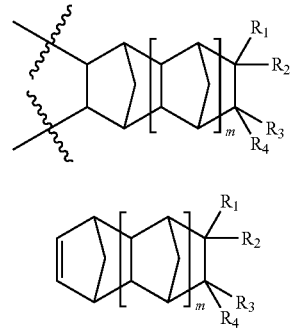

(IA)

(I)

wherein:
m is an integer 0, 1 or 2;
at least one of $R_1$, $R_2$, $R_3$ and $R_4$ independently represents a group of formula (A):

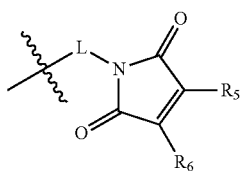

(A)

wherein:
L represents (CH$_2$)$_n$, CH$_2$OCH$_2$CH$_2$, OCH$_2$, O(CH$_2$)$_o$—OCH$_2$, (OCH$_2$CH$_2$)$_p$, (CH$_2$)$_n$—CO—O, (CH$_2$)$_n$-phenylene, phenylene, where n and p independently are integers from 0 to 15 inclusive and o is an integer from 1 to 15 inclusive; and R$_5$ and R$_6$ are each independently of one another hydrogen or linear or branched (C$_1$-C$_6$)alkyl; or R$_5$ and R$_6$ taken together with the carbon atom to which they are attached form a (C$_5$-C$_7$)cycloalkyl or (C$_6$-C$_{12}$)bicycloalkyl ring;

remaining one or more of R$_1$, R$_2$, R$_3$ and R$_4$ independently represents hydrogen, linear or branched (C$_1$-C$_{12}$)alkyl, hydroxy(C$_1$-C$_{12}$)alkyl, perfluoro(C$_1$-C$_{12}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_3$)alkyl, perfluoro(C$_6$-C$_{10}$)aryl, perfluoro(C$_6$-C$_{10}$)aryl(C$_1$-C$_3$)alkyl, (C$_5$-C$_{10}$)heteroaryl, (C$_5$-C$_{10}$)heteroaryl(C$_1$-C$_3$)alkyl, hydroxy, (C$_1$-C$_{12}$)alkoxy, (C$_3$-C$_{12}$)cycloalkoxy, (C$_6$-C$_{12}$)bicycloalkoxy, (C$_7$-C$_{14}$)tricycloalkoxy, (C$_6$-C$_{10}$)aryloxy(C$_1$-C$_3$)alkyl, (C$_5$-C$_{10}$)heteroaryloxy(C$_1$-C$_3$) alkyl, (C$_6$-C$_{10}$)aryloxy, (C$_5$-C$_{10}$heteroaryloxy, (C$_1$-C$_6$) acyloxy and halogen; and a second type of repeating unit represented by formula (IIA) or (IIB), said second type of repeating unit is derived from a monomer of formula (II):

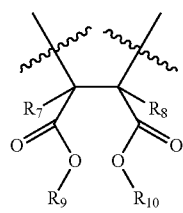

(IIA)

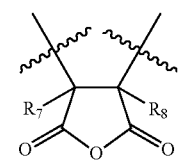

(IIB)

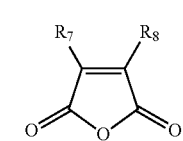

(II)

wherein:
R$_7$, R$_8$, R$_9$ and R$_{10}$ are each independently of one another hydrogen or linear or branched (C$_1$-C$_9$)alkyl, fluorinated or perfluorinated(C$_1$-C$_9$)alkyl, (C$_1$-C$_{12}$)alkoxy(C$_1$-C$_{12}$) alkyl or (C$_1$-C$_{12}$)alkoxy(C$_1$-C$_{12}$)alkoxy(C$_1$-C$_{12}$)alkyl; and wherein each of aforementioned groups, where valence is permissible, is optionally substituted with one or more groups selected from linear or branched (C$_1$-C$_6$)alkyl, (C$_3$-C$_7$)cycloalkyl, (C$_1$-C$_6$)perfluoroalkyl, (C$_1$-C$_6$) alkoxy, (C$_3$-C$_7$)cycloalkoxy, (C$_1$-C$_6$)perfluoroalkoxy, halogen, hydroxy, linear or branched hydroxy(C$_1$-C$_6$) alkyl, acetoxy, phenyl, hydroxyphenyl and acetoxyphenyl;

optionally a photo active compound;
optionally an epoxy resin; and
a solvent.

11. The composition according to claim 10 where said polymer further comprising a third type of repeating unit represented by formula (IIIA), said third type of repeating unit is derived from a monomer of formula (III):

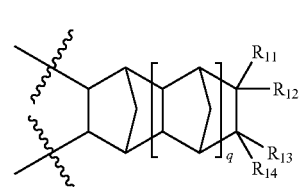

(IIIA)

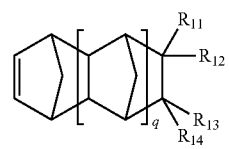

(III)

wherein:
q is an integer 0, 1 or 2;
R$_{11}$, R$_{12}$, R$_{13}$ and R$_{14}$ independently represents hydrogen, linear or branched (C$_1$-C$_{12}$)alkyl, hydroxy(C$_1$-C$_{12}$) alkyl, perfluoro(C$_1$-C$_{12}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, perfluoro(C$_6$-C$_{10}$)aryl, perfluoro(C$_6$-C$_{10}$)aryl(C$_1$-C$_3$) alkyl, (C$_5$-C$_{10}$)heteroaryl, (C$_5$-C$_{10}$)heteroaryl(C$_1$-C$_3$) alkyl, hydroxy, (C$_1$-C$_{12}$)alkoxy, (C$_3$-C$_{12}$)cycloalkoxy, (C$_6$-C$_{12}$)bicycloalkoxy, (C$_7$-C$_{14}$)tricycloalkoxy, (C$_6$-C$_{10}$)aryloxy, (C$_6$-C$_{10}$)aryloxy(C$_1$-C$_3$)alkyl, (C$_5$-C$_{10}$) heteroaryloxy(C$_1$-C$_3$)alkyl, (C$_6$-C$_{10}$)aryloxy, (C$_5$-C$_{10}$) heteroaryloxy, (C$_1$-C$_6$)acyloxy and halogen.

12. The composition according to claim 10, wherein said first repeat unit of said polymer is derived from:
1-(bicyclo[2.2.1]hept-5-en-2-ylmethyl)-3,4-dimethyl-1H-pyrrole-2,5-dione;
1-(4-(bicyclo[2.2.1]hept-5-en-2-yl)butyl)-3,4-dimethyl-1H-pyrrole-2,5-dione; and
1-(9-(bicyclo[2.2.1]hept-5-en-2-yl)nonyl)-3,4-dimethyl-1H-pyrrole-2,5-dione; and
said second repeat unit of said polymer is derived from maleic anhydride; and
said third repeat unit of said polymer is derived from:
5-perfluorobutylbicyclo[2.2.1]hept-2-ene;
5-pentafluorophenylbicyclo[2.2.1]hept-2-ene; and
1,2,3,4,4a,5,8,8a-octahydro-1,4:5,8-dimethanonaphthalene.

13. The composition according to claim 10, wherein said photoactive compound comprises a 1,2-naphthoquinonediazide-5-sulfonyl moiety and/or a 1,2-naphthoquinonediazide-4-sulfonyl moiety as represented by structural formulae (VIIa) and (VIIb), respectively:

(VIIa)

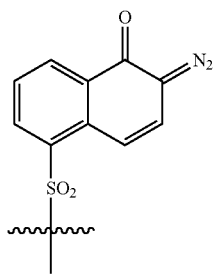

(VIIb)

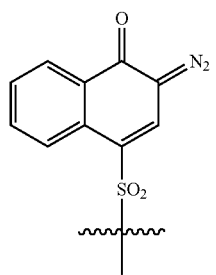

or a sulfonyl benzoquinone diazide group represented by structural formula (VIIc):

(VIIc)

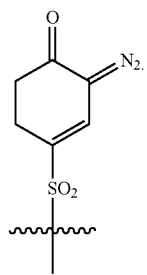

14. The composition according to claim 13, wherein said photoactive compound is

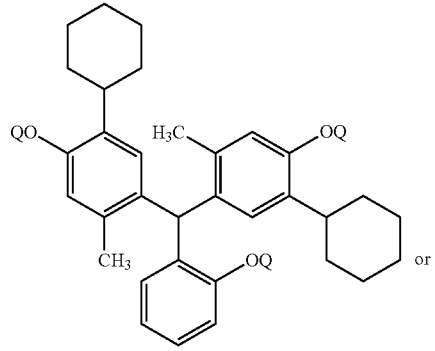

or

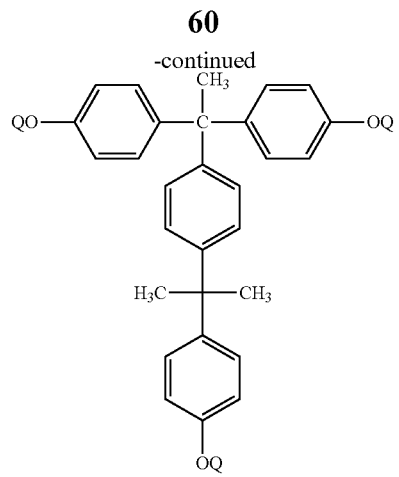

wherein at least one of Q is a group of formula (VIIa) or (VIIb):

(VIIa)

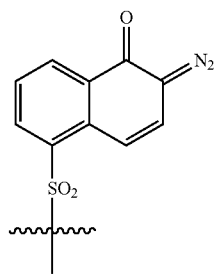

(VIIb)

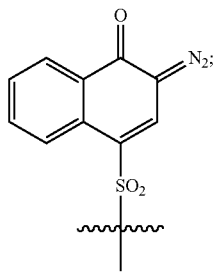

and the remaining Q is hydrogen.

15. The composition according to claim 10, wherein said epoxy resin is selected from the group consisting of:

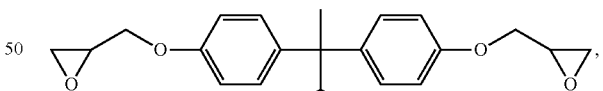

-continued

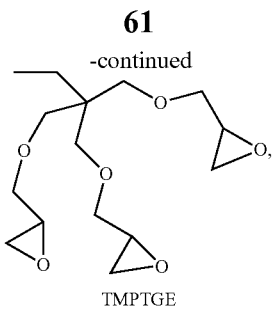

TMPTGE or a mixture thereof.

16. The composition according to claim 10, wherein said solvent is propyleneglycol monomethylether acetate (PGMEA) or N-methylpyrrolidone (NMP).

17. The composition according to claim 10, wherein said solvent is N-methylpyrrolidone (NMP).

18. A process for forming a cured product, comprising: (i) applying the layer forming polymer composition of claim 10 on a substrate to form a coating film, (ii) exposing the coating film to light through a desired pattern mask, (iii) dissolving and removing the exposed portions by developing with an alkaline developer to obtain the desired pattern, and (iv) heating the obtained desired pattern.

19. A cured product obtained by curing the layer forming polymer composition of claim 10.

20. An optoelectronic or microelectronic device comprising the cured product of claim 19, which is having a dielectric constant of 3.2 or less at 1 MHz and a transparency at 400 nm of more than 85% after curing at 250° C. for 30 minutes.

* * * * *